(12) United States Patent
Fan et al.

(10) Patent No.: US 10,644,011 B1
(45) Date of Patent: May 5, 2020

(54) NON-VOLATILE MEMORY

(71) Applicant: IoTMemory Technology Inc., Taipei (TW)

(72) Inventors: Der-Tsyr Fan, Taoyuan (TW); I-Hsin Huang, Taoyuan (TW); Yu-Ming Cheng, Yilan County (TW)

(73) Assignee: IoTMemory Technology Inc., Taipei (TW)

( * ) Notice: Subject to any disclaimer, the term of this patent is extended or adjusted under 35 U.S.C. 154(b) by 0 days.

(21) Appl. No.: 16/359,983

(22) Filed: Mar. 20, 2019

(30) Foreign Application Priority Data

Nov. 9, 2018 (TW) .............................. 107139903 A

(51) Int. Cl.
| | |
|---|---|
| *H01L 29/788* | (2006.01) |
| *H01L 27/11519* | (2017.01) |
| *H01L 29/78* | (2006.01) |
| *H01L 29/423* | (2006.01) |
| *H01L 29/06* | (2006.01) |

(Continued)

(52) U.S. Cl.
CPC .... *H01L 27/11519* (2013.01); *H01L 29/0696* (2013.01); *H01L 29/40114* (2019.08); *H01L 29/42328* (2013.01); *H01L 29/4933* (2013.01); *H01L 29/517* (2013.01); *H01L 29/788* (2013.01); *H01L 29/7851* (2013.01)

(58) Field of Classification Search
CPC ............. H01L 29/66825; H01L 29/788; H01L 29/40114; H01L 29/7881; H01L 27/11524; H01L 29/42324; H01L 27/11519; H01L 27/1157; H01L 27/11529; H01L 27/11568; H01L 27/1156; H01L 29/42332; H01L 27/11517; H01L 27/11558; H01L 29/517; H01L 29/7841; H01L 29/42348; H01L 29/7831; H01L 29/0692; H01L 29/0696
USPC ......................................................... 257/315
See application file for complete search history.

(56) References Cited

U.S. PATENT DOCUMENTS

| | | |
|---|---|---|
| 6,229,176 B1 | 5/2001 | Hsieh et al. |
| 6,313,498 B1 | 11/2001 | Chen |

(Continued)

FOREIGN PATENT DOCUMENTS

| | | |
|---|---|---|
| TW | 201637197 | 10/2016 |
| TW | 201839770 | 11/2018 |

OTHER PUBLICATIONS

Fang et al., "A novel symmetrical split-gate structure for 2-bit per cell flash memory," Journal of Semiconductors, vol. 35, Issue 7, Jul. 2014, p. 074008-1-p. 074008-4.

(Continued)

*Primary Examiner* — Theresa T Doan
(74) *Attorney, Agent, or Firm* — JCIPRNET

(57) ABSTRACT

A non-volatile memory having memory cells is provided. The memory cell includes a source region and a drain region, a select gate, a dummy select gate, a floating gate, an erase gate, and a control gate. The select gate is disposed on the substrate between the source region and the drain region. The floating gate is disposed on the substrate between the select gate and the source region, and a top portion of the floating gate has corners in symmetry. The height of the floating gate is lower than the height of the select gate. The erase gate is provided on the source region and covers the corner at the side of the source. The control gate is disposed on the erase gate and the floating gate.

15 Claims, 24 Drawing Sheets

(51) Int. Cl.
  *H01L 29/49*    (2006.01)
  *H01L 29/51*    (2006.01)
  *H01L 21/28*    (2006.01)

(56) References Cited

U.S. PATENT DOCUMENTS

| | | |
|---|---|---|
| 6,773,993 B2 | 8/2004 | Lin et al. |
| 7,884,412 B2 | 2/2011 | Huang et al. |
| 7,927,994 B1 | 4/2011 | Liu et al. |
| 8,711,636 B2 | 4/2014 | Do et al. |
| 9,673,338 B2 * | 6/2017 | Fan .................. H01L 29/66825 |
| 9,859,291 B2 | 1/2018 | Cheng et al. |
| 2006/0203552 A1 * | 9/2006 | Chen .................. G11C 16/0425 365/185.17 |
| 2015/0349096 A1 | 12/2015 | Winstead et al. |

OTHER PUBLICATIONS

S.K. Saha, "Scaling considerations for sub-90 nm split-gate flash memory cells," IET Circuits Devices Syst., vol. 2, Issue 1, Feb. 2008, pp. 144-150.

Dong et al., "Erase voltage impact on 0.18 μm triple self-aligned split-gate flash memory endurance," Journal of Semiconductors, vol. 31, Issue 6, Jun. 2010, p. 064012-1-p. 064012-4.

"Office Action of Taiwan Counterpart Application," dated Nov. 5, 2019, p. 1-p. 7.

* cited by examiner

NON-VOLATILE MEMORY

CROSS-REFERENCE TO RELATED APPLICATION

This application claims the priority benefit of Taiwan application serial no. 107139903, filed on Nov. 9, 2018. The entirety of the above-mentioned patent application is hereby incorporated by reference herein and made a part of this specification.

BACKGROUND OF THE INVENTION

Field of the Invention

The invention relates to a semiconductor device and a manufacturing method thereof. More particularly, the invention relates to a non-volatile memory and a manufacturing method thereof.

Description of Related Art

A non-volatile memory allows multiple data writing, reading and erasing operations, and the stored data is retained even after power is cut off. With these characteristics, non-volatile memories have been widely used in personal computers and electronic equipment.

The typical design of a non-volatile memory includes a stack-gate structure, and the stack-gate structure includes a tunneling oxide layer, a floating gate, an inter-gate dielectric layer, and a control gate that are sequentially disposed on a substrate. To program data into or erase data from the non-volatile memory device, a suitable voltage is applied to the source region, the drain region and the control gate, respectively, so that electrons are injected into a polysilicon floating gate or pulled out from the polysilicon floating gate.

In the operation of the non-volatile memory, in general, the greater the gate-coupling ratio (GCR) between the floating gate and the control gate, the lower the working voltage for the operation thereof, in which case the operational speed and efficiency of the non-volatile memory are greatly enhanced. A method of increasing the gate-coupling ratio includes increasing an overlap area between the floating gate and the control gate, reducing the thickness of the dielectric layer between the floating gate and the control gate, and increasing the dielectric constant (k) of the inter-gate dielectric layer between the floating gate and the control gate, etc.

In the operation of the non-volatile memory, in general, the smaller the gate resistance, the faster the operational speed of the non-volatile memory. A method of reducing the gate resistance includes using a metal silicide, a metal gate, or the like.

With the continuous miniaturization of semiconductor devices as the level of integration of integrated circuits increases, the dimension of a memory cell of the non-volatile memory must also be reduced in order to increase the level of integration. The dimension of a memory cell can be reduced by reducing the gate length of the memory cell, the interval of bit lines, etc. However, when the gate length is reduced, the channel length under the tunneling oxide layer is reduced correspondingly. Thus, an abnormal punch through between the drain and the source may occur easily, which greatly affects the electrical performance of the memory cell. In addition, the electrons repetitively passing through the tunneling oxide layer during programming or erasing of memory cells may wear off the tunneling oxide layer and thus reduce the reliability of the memory device.

SUMMARY OF THE INVENTION

The invention provides a non-volatile memory and a manufacturing method thereof capable of being operated at a low operational voltage, so as to facilitate the reliability of the semiconductor device.

The invention provides a non-volatile memory and a manufacturing method thereof capable of reducing the gate resistance, so as to facilitate the operational speed of the semiconductor device.

The invention provides a non-volatile memory and a manufacturing method thereof capable of increasing the level of integration of the device.

The invention provides a non-volatile memory having a first memory cell. The memory cell is disposed on the substrate. The first memory cell includes a source region and a drain region, a select gate, a dummy select gate, a floating gate, an erase gate, a control gate, a tunneling dielectric layer, an erase gate dielectric layer, a select gate dielectric layer, an insulating layer, and an inter-gate dielectric layer. The source region and the drain region are respectively disposed in the substrate. The select gate is disposed on the substrate between the source region and the drain region. The dummy select gate is disposed between the substrate and the erase gate. The floating gate is disposed on the substrate between the select gate and the source region, and a top portion of the floating gate has two corners. The height of the floating gate is lower than the height of the select gate. The erase gate is provided on the source region and covers the corner at the side of the source. The control gate is disposed on the erase gate and the floating gate. The tunneling dielectric layer is disposed between the substrate and the floating gate. The erase gate dielectric layer is disposed between the erase gate and the floating gate. The select gate dielectric layer is disposed between the select gate and the substrate. The insulating layer is disposed between the select gate and the floating gate. The inter-gate dielectric layer is disposed between the control gate and the floating gate and between the control gate and the erase gate.

According to an embodiment of the invention, the non-volatile memory further includes a second memory cell. The second memory cell is disposed on the substrate. A structure of the second memory cell is the same as a structure of the first memory cell, and the second memory cell and the first memory cell are arranged in mirror symmetry and share the source region or the drain region.

According to an embodiment of the invention, the first memory cell and the second memory cell share the erase gate, and the erase gate fills an opening between the first memory cell and the second memory cell.

According to an embodiment of the invention, the first memory cell and the second memory cell share the control gate, and the control gate covers the erase gate.

According to an embodiment of the invention, a material of the control gate includes polysilicon and metal silicide.

According to an embodiment of the invention, a material of the select gate includes polysilicon and metal silicide.

According to an embodiment of the invention, the control gate fills an opening between the select gate and the erase gate.

According to an embodiment of the invention, a material of the inter-gate dielectric layer includes silicon oxide/silicon nitride/silicon oxide, silicon nitride/silicon oxide, or other high-k materials with a value of k greater than 4.

According to an embodiment of the invention, a material of the control gate includes metal.

According to an embodiment of the invention, a material of the select gate includes metal.

According to an embodiment of the invention, the non-volatile memory further includes a dummy select gate. The dummy select gate is disposed between the substrate and the erase gate. The height of the FG adjacent to select gate is lower than the select gate, and the height of the FG adjacent to dummy select gate is higher than the dummy select gate.

According to an embodiment of the invention, the non-volatile memory is arranged as a FinFET.

According to an embodiment of the invention, the floating gate has a notch.

The invention provides a manufacturing method of a non-volatile memory. Firstly, a substrate with a source region formed in the substrate is provided. A first stacked structure and a second stacked structure are formed on the substrate. The first stacked structure and the second stacked structure sequentially include a select gate dielectric layer, a select gate, and a cap layer from the substrate. In addition, the second stacked structure is located on the source region. A tunneling dielectric layer is formed on the substrate between the first stacked structure and the second stacked structure. A self-aligned floating gate is formed on the substrate between the first stacked structure and the second stacked structure. A height of the floating gate is lower than a height of the select gate, and a top portion of the floating gate adjacent to the first stacked structure and the second stacked structure has two corners in symmetry. The cap layer is removed. At least a portion of the select gate (i.e., the dummy select gate) of the second stacked structure is removed, and the corner of the floating gate is exposed. An erase gate dielectric layer is formed on the floating gate including the corners. An erase gate is formed on the substrate or a portion of the second stacked structure. The erase gate covers the corner of the floating gate close to a side of the source region. An inter-gate dielectric layer is formed on the floating gate and the erase gate. A control gate is formed on the floating gate.

According to an embodiment of the invention, forming the floating gate on the substrate between the first stacked structure and the second stacked structure includes: forming a conductive spacer between the first stacked structure and the second stacked structure, and patterning the conductive spacer to form the floating gate.

According to an embodiment of the invention, the manufacturing method of the non-volatile memory further includes forming a drain region in the substrate at a side opposite to another side of the first stacked structure adjacent to the floating gate.

According to an embodiment of the invention, the manufacturing method of the non-volatile memory further includes forming a metal silicide layer in the select gate, the control gate, and the drain region.

According to an embodiment of the invention, in at least removing the portion of the select gate of the second stacked structure, the entire select gate of the second stacked structure is removed.

According to an embodiment of the invention, after the entire select gate of the second stacked structure is removed, the manufacturing method of the non-volatile memory further includes forming a spacer and the erase gate dielectric layer on a sidewall of the floating gate.

According to an embodiment of the invention, forming the control gate on the floating gate includes: forming a conductive material layer on the substrate, and patterning the conductive material layer to form the control gate covering the floating gate and the erase gate.

According to an embodiment of the invention, forming the control gate on the floating gate includes: forming a conductive material layer on the substrate, and performing a planarization process to remove a portion of the conductive material layer and patterning the conductive material layer to form the control gate at a side of the erase gate and above the floating gate.

In the non-volatile memory and the manufacturing method thereof of the invention, the floating gate has a notch, so the area sandwiched between the control gate and the floating gate is increased, and the coupling rate of the memory device is increased.

In the non-volatile memory and the manufacturing method thereof of the invention, the floating gate has the corner, and the erase gate covers the corner. The angle of the corner is smaller than or equal to 90 degrees. With the corner, the electrical field is concentrated, so the erase voltage can be lowered to efficiently pull electrons from the floating gate, thereby facilitating the speed of erasing data.

In the non-volatile memory and the manufacturing method thereof of the invention, the surfaces of the select gate, the control gate, and the erase gate are coplanar. Therefore, the level of integration of the memory device can be increased.

In the non-volatile memory and the manufacturing method thereof of the invention, by performing the high-k metal gate (HKMG) manufacturing process so that the select gate and/or the control gate is formed as a high-k metal gate (HKMG), the transistor capacitance (by which the current is driven) can be increased, and the gate leakage and the threshold voltage can be decreased. In this way, the device performance is facilitated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A to 2I are schematic cross-sectional views illustrating a manufacturing process of a non-volatile memory according to an embodiment of the invention.

DESCRIPTION OF THE EMBODIMENTS

Figure 1A:
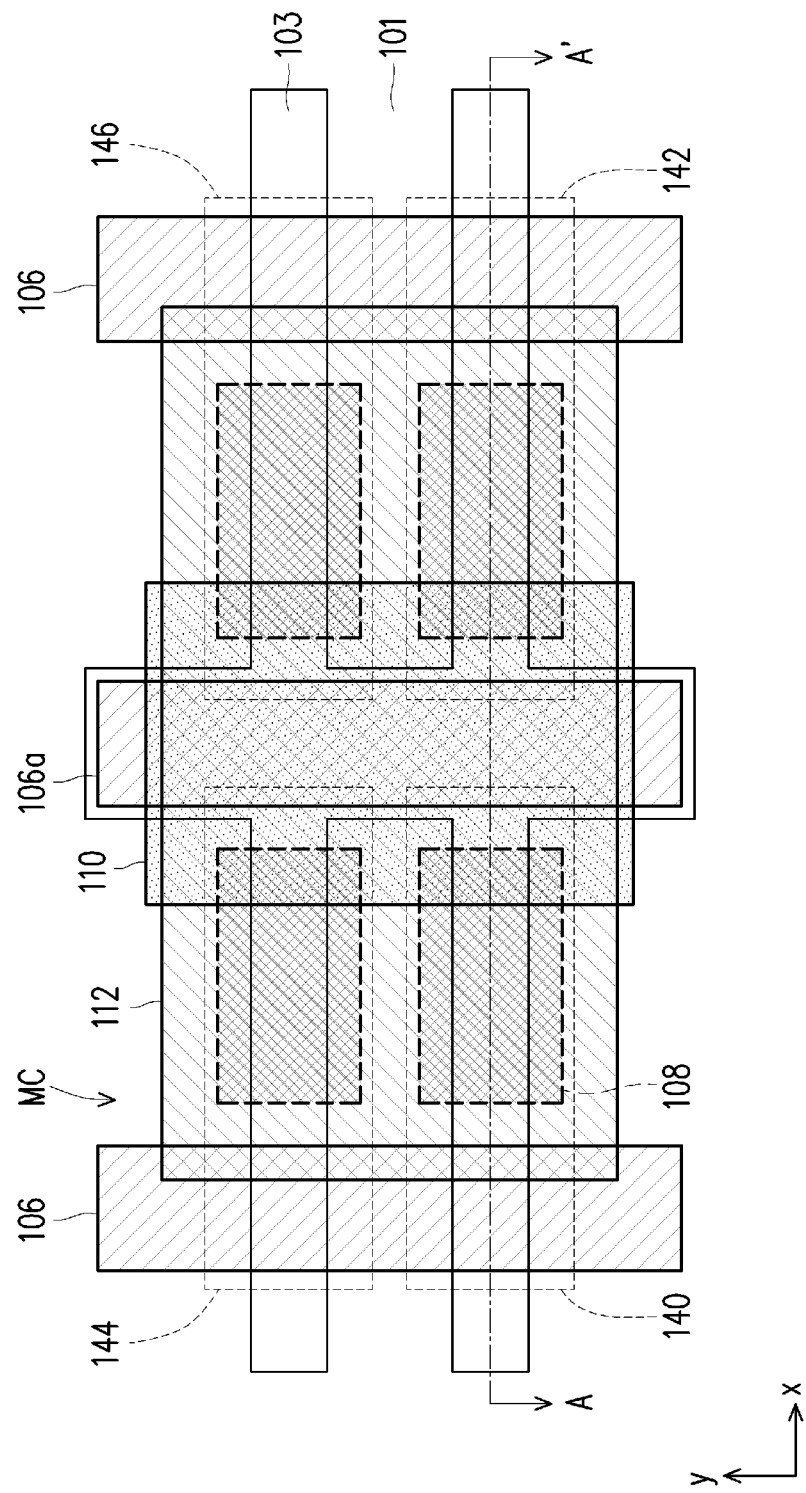
FIG. 1A is a top view illustrating a non-volatile memory according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
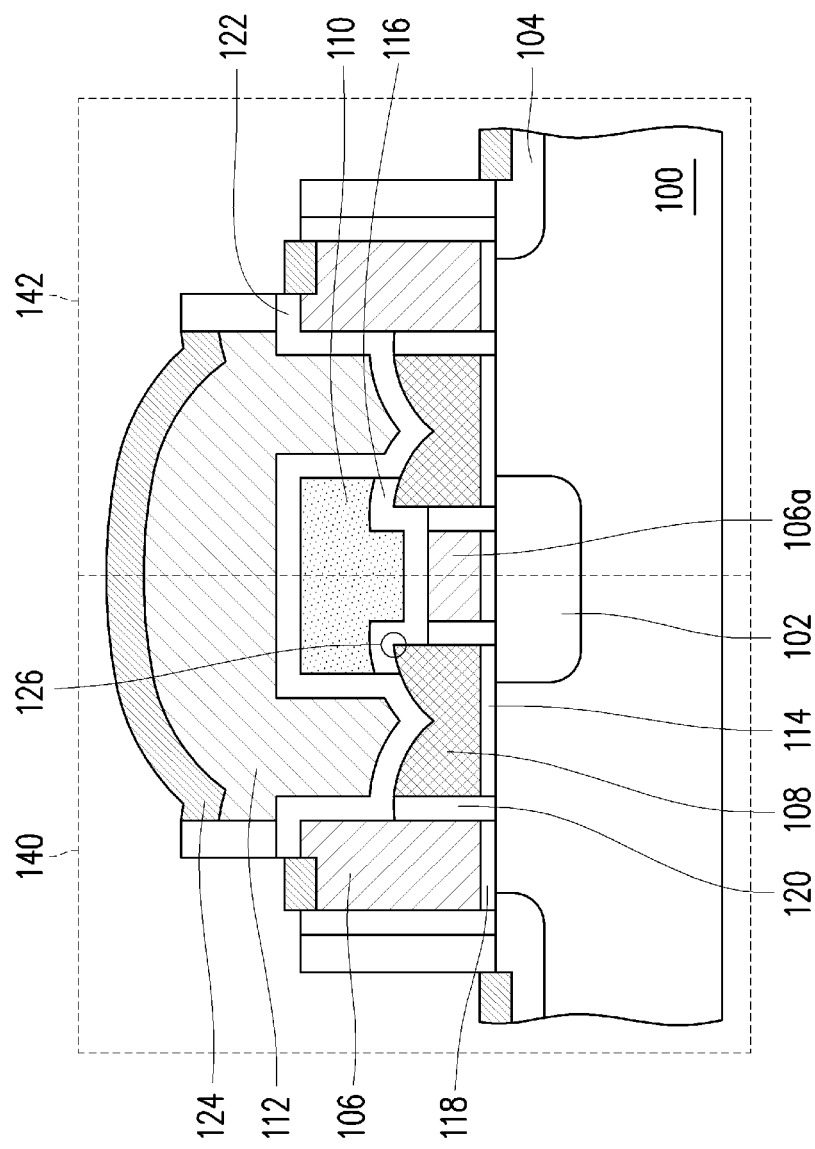
FIG. 1B is a schematic cross-sectional view illustrating a non-volatile memory according to an embodiment of the invention.
Figure 1C:
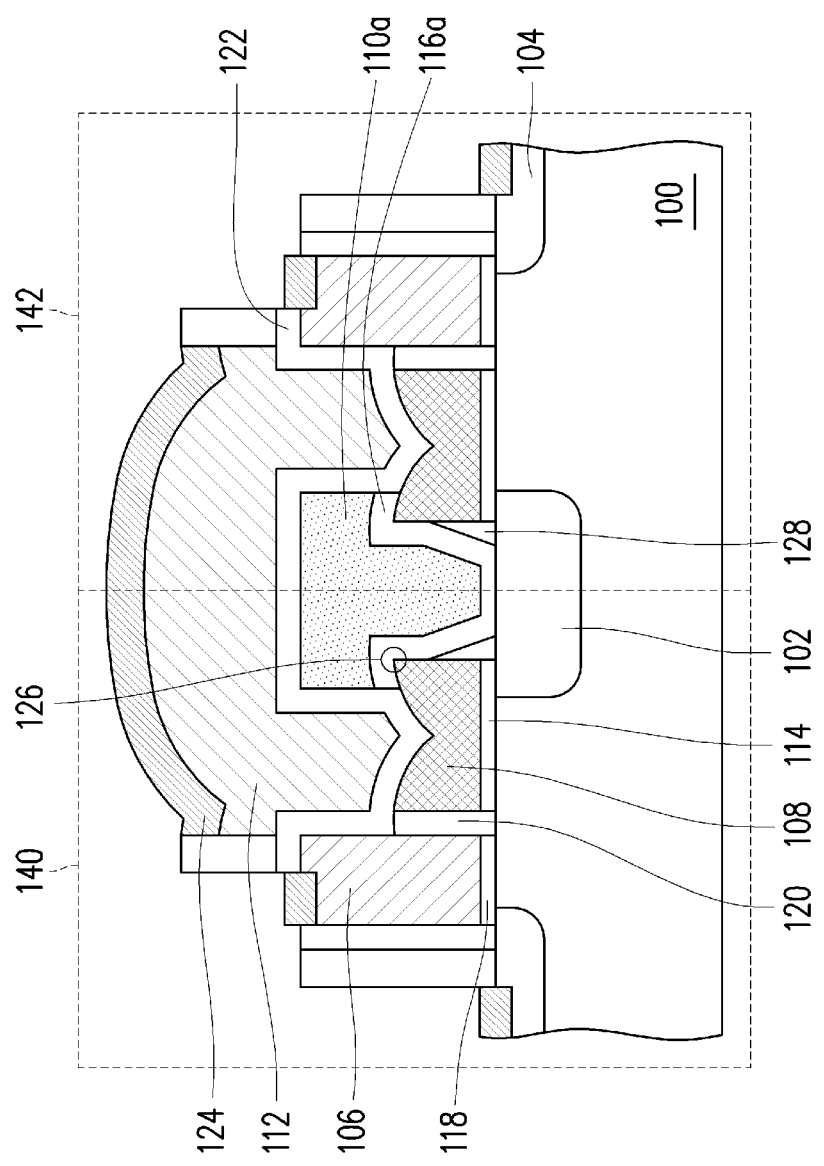
FIG. 1C is a schematic cross-sectional view illustrating a non-volatile memory according to an embodiment of the invention.
Figure 1D:
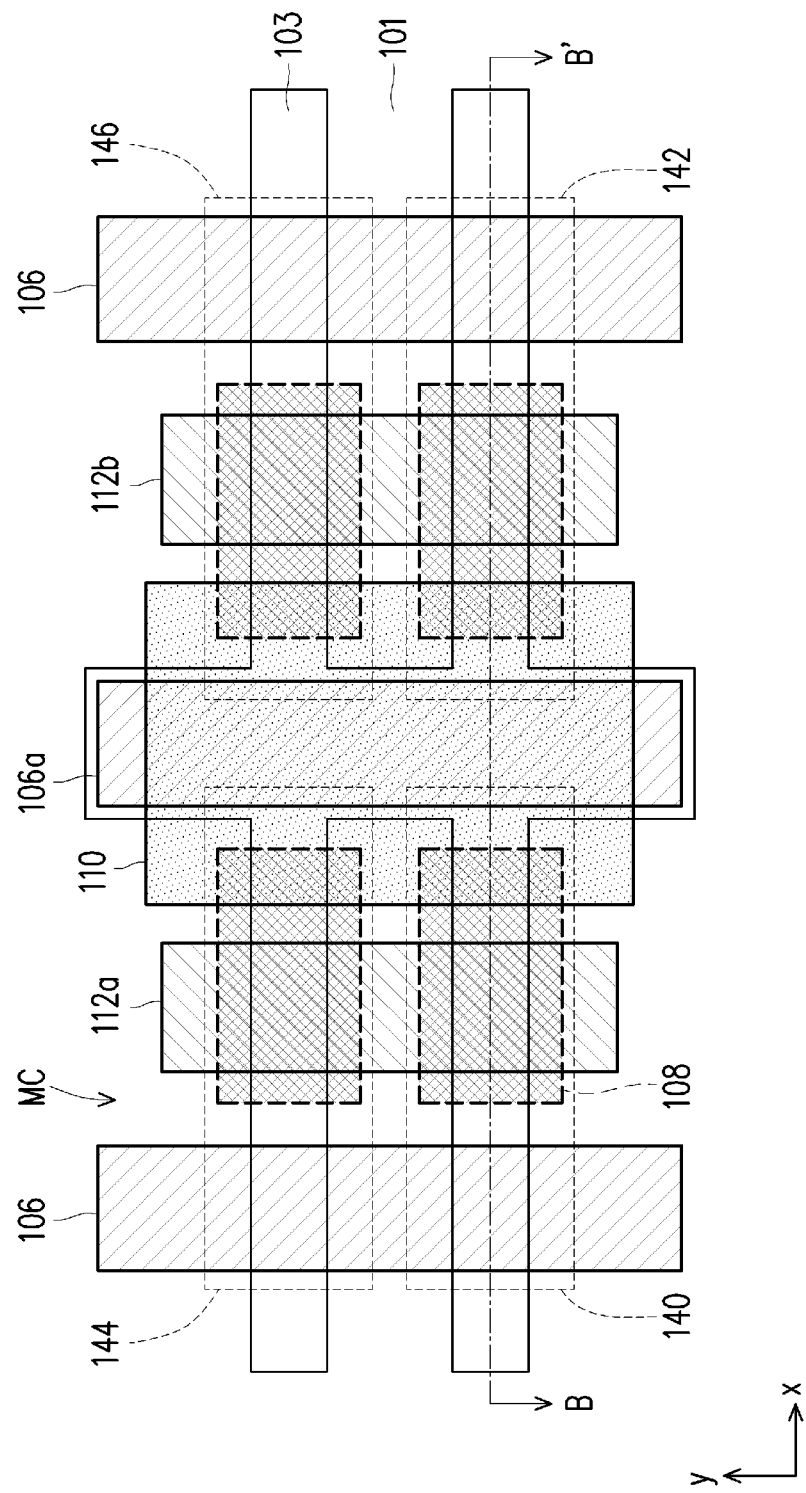
FIG. 1D is a top view illustrating a non-volatile memory according to an embodiment of the invention.
Figure 1E:
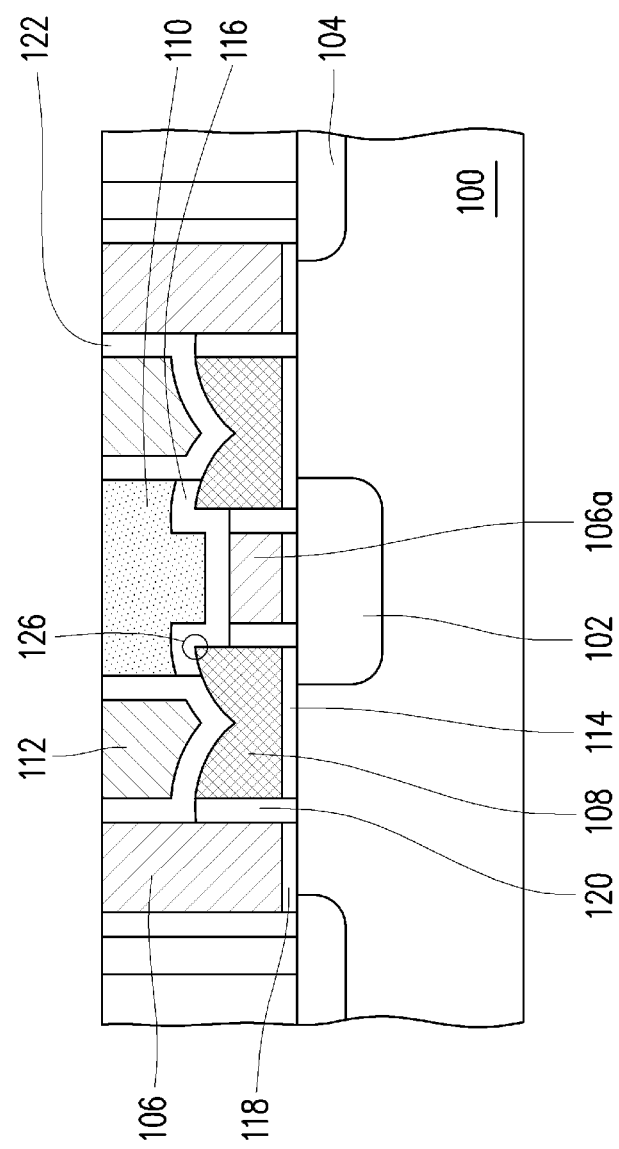
FIG. 1E is a schematic cross-sectional view illustrating a non-volatile memory according to an embodiment of the invention.

FIG. 1A is a top view illustrating a non-volatile memory according to an embodiment of the invention. FIG. 1B is a schematic cross-sectional view illustrating a non-volatile memory according to an embodiment of the invention. FIG. 1B is a cross-sectional view taken along a line A-A' as shown in FIG. 1A. FIG. 1C is a schematic cross-sectional view illustrating a non-volatile memory according to an embodiment of the invention. FIG. 1D is a top view illustrating a non-volatile memory according to an embodiment of the invention. FIG. 1E is a schematic cross-sectional view illustrating a non-volatile memory according to an embodiment of the invention. FIG. 1E is a cross-sectional view taken along a line B-B' as shown in FIG. 1D. FIGS. 1F to 1J are schematic cross-sectional views illustrating a non-volatile memory according to embodiments of the invention. In FIGS. 1B to 1J, the same components are represented with the same symbols, and the repeated descriptions thereof are omitted.

Referring to FIGS. 1A and 1B, the non-volatile memory includes a plurality of memory cells MC. The memory cells MC are arranged into a row/column array. The non-volatile memory is disposed on the substrate 100. In the substrate 100, a plurality of isolation structures 101 regularly arranged, for example, are disposed, so as to define a lattice-like active region 103. The isolation structures 101 are shallow trench isolation structures, for example.

Each of the memory cells MC includes a source region 102 and a drain region 104, a select gate 106, a floating gate 108, an erase gate 110, a control gate 112, a tunneling dielectric layer 114, an erase gate dielectric layer 116, a select gate dielectric layer 118, an insulating layer 120, and an inter-gate dielectric layer 122.

The source region 102 and the drain region 104 are respectively disposed in the substrate 100. The source region 102 and the drain region 104 are, for example, doped regions containing an N-type dopant or a P-type dopant, depending on the design of the device.

The select gate 106 is disposed on the substrate 100 between the source region 102 and the drain region 104, for example. The select gate 106 extends in the Y-direction, for example. The material of the select gate 106 includes a conductive material such as doped polysilicon, etc. In an embodiment, the material of the select gate 106 includes polysilicon and metal silicide. The floating gate 108 is disposed on the substrate 100 between the select gate 106 and the source region 102, for example. The height of the floating gate 108 is lower than the height of the select gate 106, and the top portion of the floating gate 108 at least has a corner 126. The floating gate 108 has a recess. In other words, the height of the floating gate gradually increases from the center. The material of the floating gate 108 is, for example, a conductive material such as doped polysilicon, etc. The floating gate 108 may be formed by one or more conductive layers.

In the embodiment, the non-volatile memory further includes a dummy select gate 106a. The dummy select gate 106a is disposed between the substrate 100 and the erase gate 110, for example. The insulating layer 120 is also disposed between the dummy select gate 106a and the floating gate 108, for example. The height of the side of the floating gate 108 adjacent to the dummy select gate 106a is higher than the height of the dummy select gate 106a, so as to expose the corner 126 of the top portion.

The erase gate 110 is disposed on the source region 102, for example, and the erase gate 110 covers the corner 126. The erase gate 110 extends in the Y-direction, for example. The material of the erase gate 110 is, for example, a conductive material such as doped polysilicon, etc. The control gate 112 is disposed on the erase gate 110 and the floating gate 108. The material of the control gate 112 is, for example, a conductive material such as doped polysilicon, etc. The tunneling dielectric layer 114 is disposed between the floating gate 108 and the substrate 100, for example. Moreover, the material of the tunneling dielectric layer 114 is, for example, silicon oxide. The thickness of the tunneling dielectric layer 114 ranges from 60 angstroms to 200 angstroms, for example. The erase gate dielectric layer 116 is disposed between the erase gate 110 and the floating gate 108, for example. The material of the erase gate dielectric layer 116 is silicon oxide, for example. The thickness of the erase gate dielectric layer 116 ranges from 60 angstroms to 150 angstroms, for example.

The select gate dielectric layer 118 is disposed between the select gate 106 and the substrate 100, for example. The material of the select gate dielectric layer 118 is silicon oxide, for example. The insulating layer 120 is disposed between the select gate 106 and the floating gate 108, for example. The inter-gate dielectric layer 122 is disposed between the control gate 112 and the floating gate 108 and between the control gate 112 and the erase gate 110, for example. The material of the inter-gate dielectric layer 122 is, for example, silicon oxide/silicon nitride/silicon oxide, silicon nitride/silicon oxide, or other high-k materials (k>4), for example.

In the X-direction (row direction), the memory cells MC are connected with each other in series through the source region 102 or the drain region 104. For example, the structure of a memory cell 140 and the structure of a memory cell 142 are the same, and the memory cell 140 and the memory cell 142 are arranged in mirror symmetry and share the source region 102 or the drain region 104. The structure of the memory cell 144 and the structure of the memory cell 146 are the same, and the memory cell 144 and the memory cell 146 are arranged in mirror symmetry and share the source region 102 or the drain region 104. Meanwhile, the memory cell 140, the memory cell 142, the memory cell 144, and the memory cell 146 share the erase gate 110 and the control gate 112, and the control gate 112 covers the erase gate 110.

In the Y-direction (column direction), the memory cells MC are connected in series through the source region 102, the select gate 106, the erase gate 110, and the control gate 112. In other words, in the column direction, the memory cells MC share the same source region 102, select gate 106, erase gate 110, and control gate 112. For example, the structure of the memory cell 140 and the structure of the memory cell 144 are the same, the structure of the memory cell 142 and the structure of the memory cell 146 are the same, the control gate 112 is filled between the memory cell 140 and the memory cell 144 and between the memory cell 142 and the memory cell 146. The memory cells 140 and 144 in the same column share the same source region 102, select gate 106, erase gate 110, and control gate 112.

In the embodiment, a metal silicide layer 124 is further formed on the control gate 112, the select gate 106, and the drain region 104.

In another embodiment, as shown in FIG. 1C, the dummy select gate 106a shown in FIGS. 1A and 1B is removed. An erase gate 110a fills the opening between the memory cell 140 and the memory cell 142. An insulating layer formed by the erase gate dielectric layer 116a and a spacer 128 is disposed between the erase gate 110a and the floating gate 108.

In another embodiment, as shown in FIGS. 1D and 1E, the memory cell 140 and the memory cell 142 share the erase gate 110. However, the memory cell 140 and the memory cell 142 are respectively provided with a control gate 112a and a control gate 112b. In other words, in the X-direction, the adjacent memory cells MC do not share the control gate.

In addition, as shown in FIG. 1E, the control gate 112a and the control gate 112b are disposed in notches between the select gate 106 and the erase gate 110. The surfaces of the select gate 106, the control gate 112a and the control gate 112b, and the erase gate 110a are coplanar. Therefore, the level of integration of the memory device can be increased.

Figure 1F:
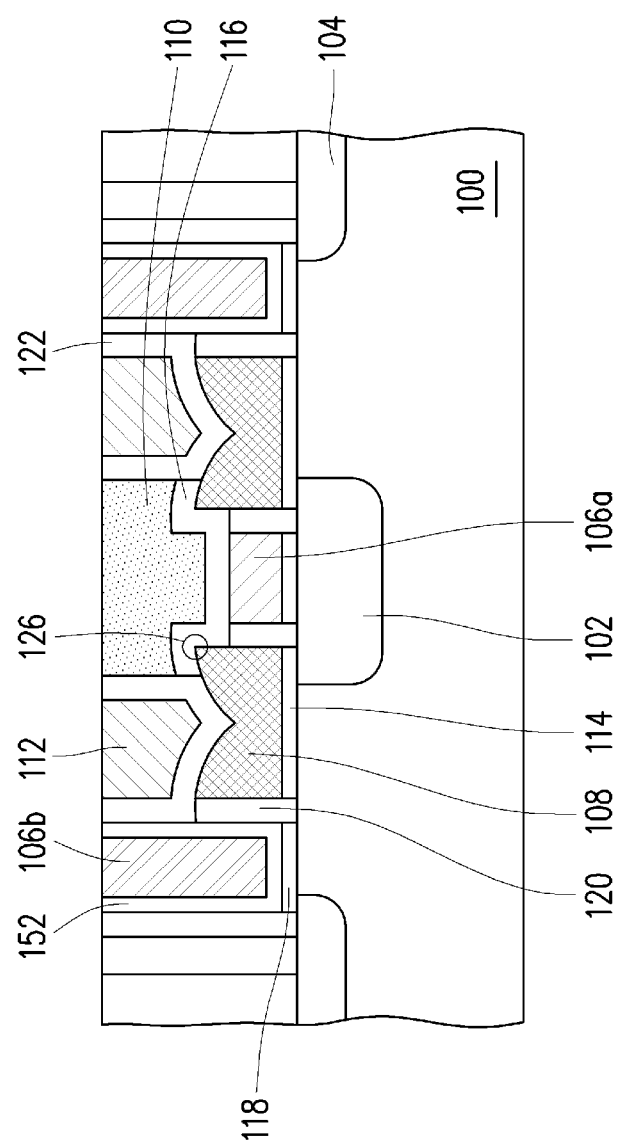
FIG. 1F is a schematic cross-sectional view illustrating a non-volatile memory according to an embodiment of the invention.

In another embodiment, a non-volatile memory shown in FIG. 1F is a modified example of the non-volatile memory shown in FIG. 1E. In the following, the descriptions will only focus on the differences. As shown in FIG. 1F, the material of a select gate 106b includes a metal material, such as aluminum, copper, tungsten, cobalt, titanium, tantalum, niobium, or zirconium, etc. A high-k dielectric layer 152 (with the value of k greater than 4) is disposed between the select gate 106b and the control gate 112a (or the control gate 112b), between the select gate 106b and the floating gate 108, and between the select gate 106b and the substrate 100. The high-k dielectric layer 152 may include HfO, HfSiO, HfAlO, or HfTaO, for example.

By arranging the select gate 106b to be a high-k metal gate (HKMG), the transistor capacitance (by which the current is driven) can be increased, and the gate leakage and the threshold voltage can be decreased. In this way, the device performance is facilitated.

Figure 1G:
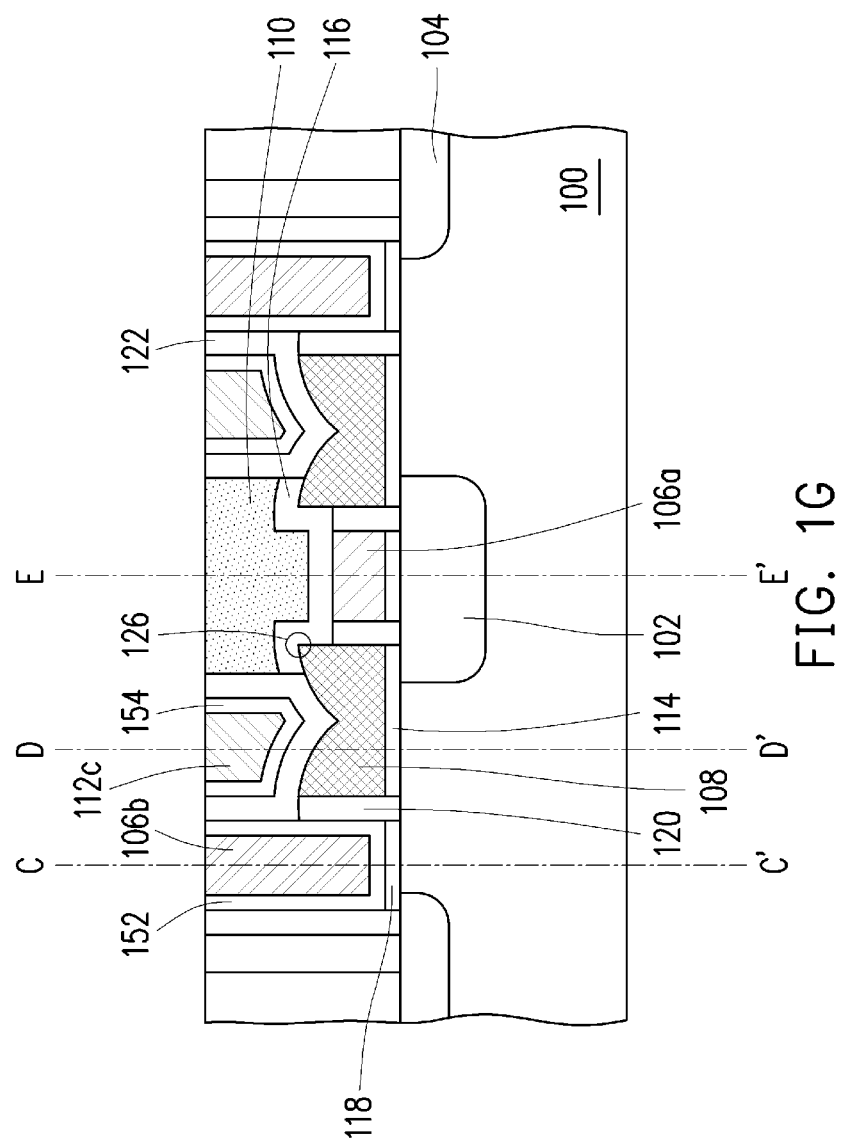
FIG. 1G is a schematic cross-sectional view illustrating a non-volatile memory according to an embodiment of the invention.

In another embodiment, a non-volatile memory shown in FIG. 1G is a modified example of the non-volatile memory shown in FIG. 1E. In the following, the descriptions will only focus on the differences. The material of the select gate 106b includes a metal material, such as aluminum, copper, tungsten, cobalt, titanium, tantalum, niobium, or zirconium, etc. The materials of a control gate 112c and a control gate 112d include a metal material, such as aluminum, copper, tungsten, cobalt, titanium, tantalum, niobium, or zirconium, etc.

The high-k dielectric layer 152 (with the value of k greater than 4) is disposed between the select gate 106b and the control gate 112c (or the control gate 112d), between the select gate 106b and the floating gate 108, and between the select gate 106b and the substrate 100. The high-k dielectric layer 152 may include HfO, HfSiO, HfAlO, or HfTaO, for example. By arranging the select gate 106b to be a high-k metal gate (HKMG), the transistor capacitance (by which the current is driven) can be increased, and the gate leakage and the threshold voltage can be decreased. In this way, the device performance is facilitated.

A high-k dielectric layer 154 (with the value of k greater than 4) is disposed between the control gate 112c (or the control gate 112d) and the erase gate 110 and between the control gate 112c (or the control gate 112d) and the floating gate 108. The high-k dielectric layer 154 may include HfO, HfSiO, HfAlO, or HfTaO, for example. By arranging the control gate 112c (or the control gate 112d) to be a high-k metal gate (HKMG), the gate-coupling ratio (GCR) between the floating gate and the control gate is increased, the working voltage required for the operation thereof is decreased, and the operational speed and efficiency of the non-volatile memory are greatly enhanced.

Figure 1H:
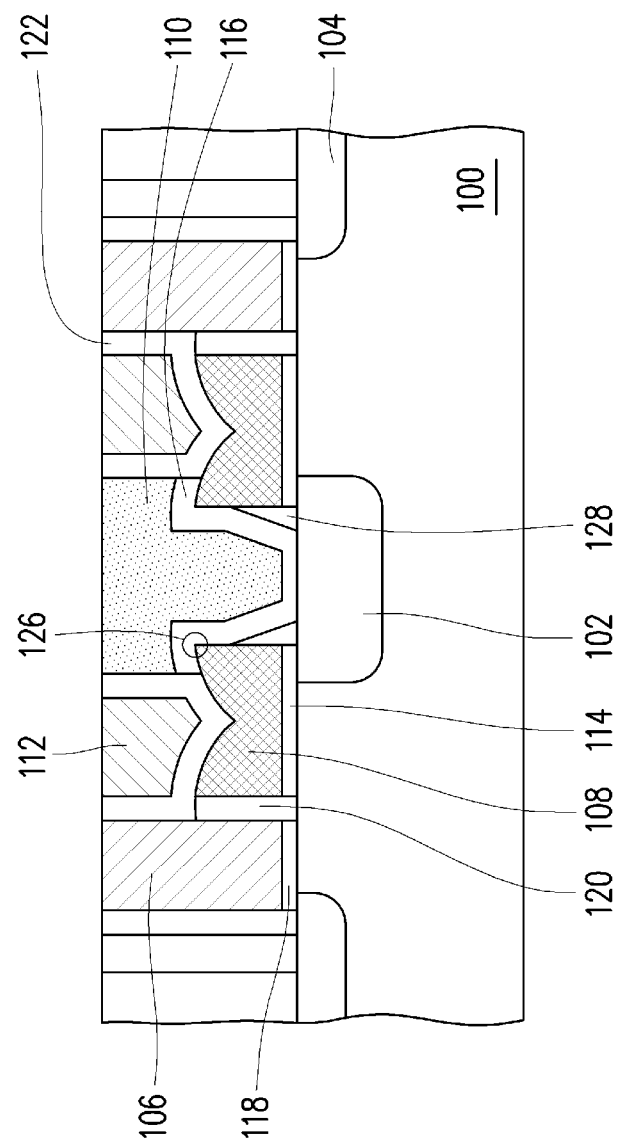
FIG. 1H is a schematic cross-sectional view illustrating a non-volatile memory according to an embodiment of the invention.

In another embodiment, as shown in FIG. 1H, the memory cell 140 and the memory cell 142 share the erase gate 110. However, the memory cell 140 and the memory cell 142 are respectively provided with the control gate 112a and the control gate 112b. In other words, in the X-direction, the adjacent memory cells MC do not share the control gate. In addition, the dummy select gate 106a shown in FIGS. 1A and 1B is removed. The erase gate 110a fills the opening between the memory cell 140 and the memory cell 142. The insulating layer formed by the erase gate dielectric layer 116a and the spacer 128 is disposed between the erase gate 110a and the floating gate 108.

Figure 1I:
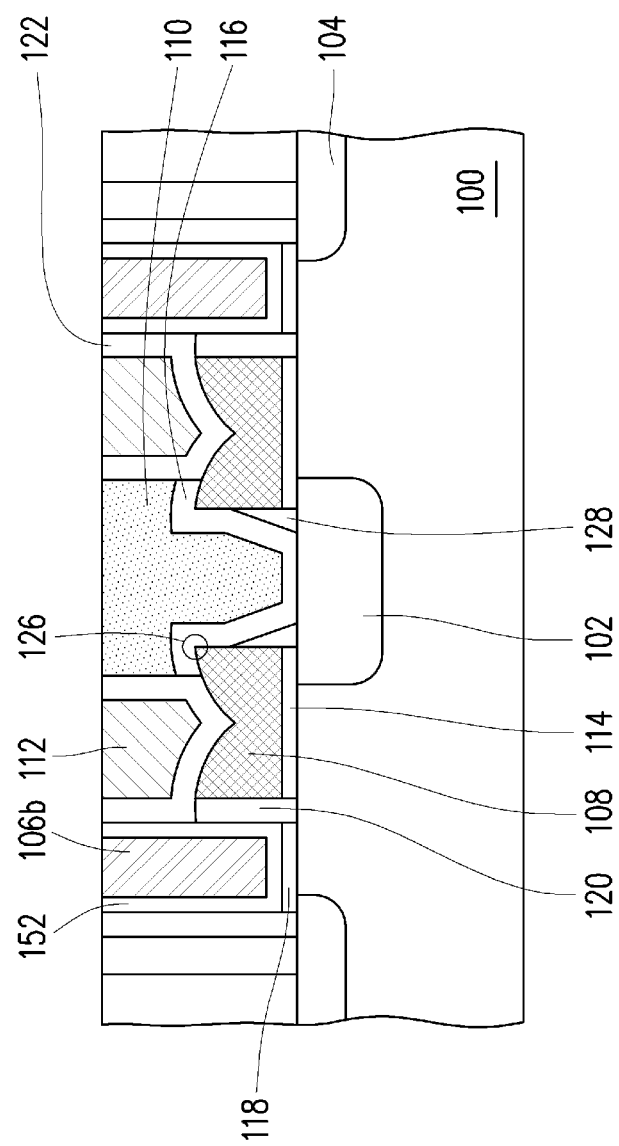
FIG. 1I is a schematic cross-sectional view illustrating a non-volatile memory according to an embodiment of the invention.

In another embodiment, a non-volatile memory shown in FIG. 1I is a modified example of the non-volatile memory shown in FIG. 1H. In the following, the descriptions will only focus on the differences. As shown in FIG. 1I, the material of the select gate 106b includes a metal material, such as aluminum, copper, tungsten, cobalt, titanium, tantalum, niobium, or zirconium, etc. The high-k dielectric layer 152 (with the value of k greater than 4) is disposed between the select gate 106b and the control gate 112a (or the control gate 112b), between the select gate 106b and the floating gate 108, and between the select gate 106b and the substrate 100. The high-k dielectric layer 152 may include HfO, HfSiO, HfAlO, or HfTaO, for example.

By arranging the select gate 106b to be a high-k metal gate (HKMG), the transistor capacitance (by which the current is driven) can be increased, and the gate leakage and the threshold voltage can be decreased. In this way, the device performance is facilitated.

Figure 1J:
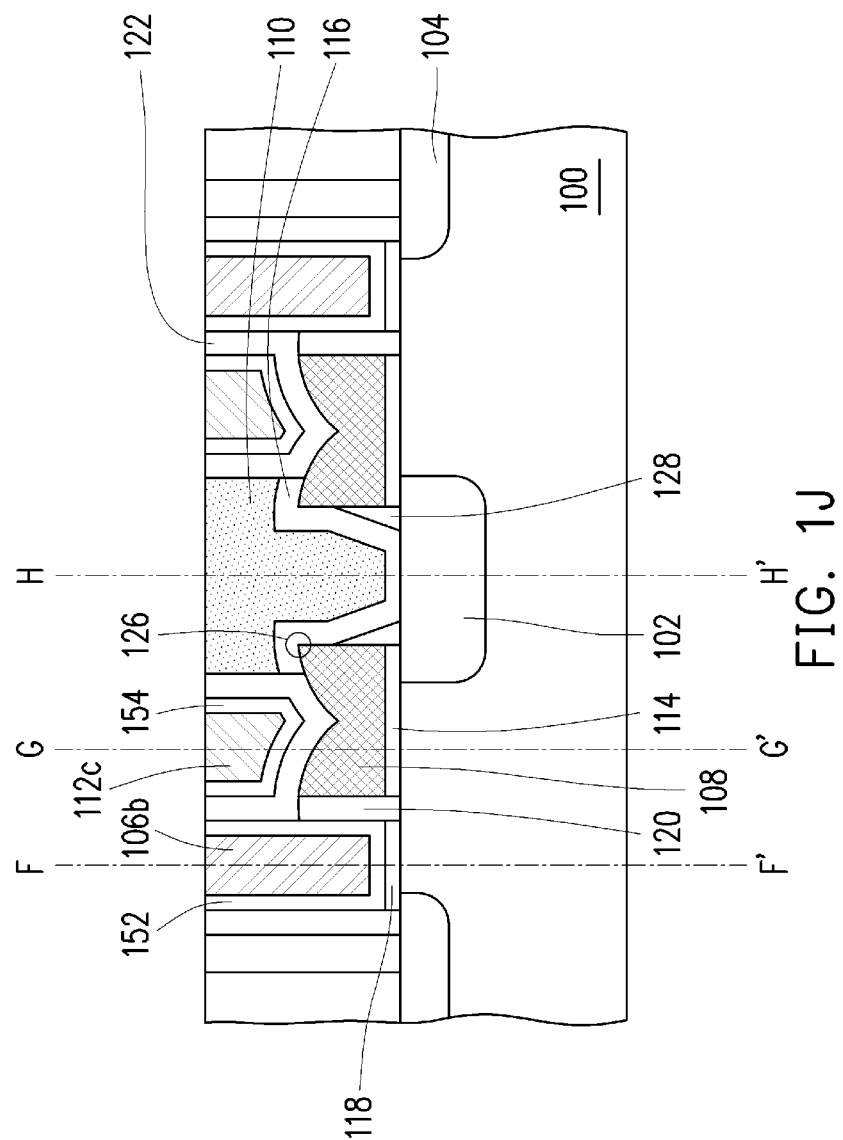
FIG. 1J is a schematic cross-sectional view illustrating a non-volatile memory according to an embodiment of the invention.

In another embodiment, a non-volatile memory shown in FIG. 1J is a modified example of the non-volatile memory shown in FIG. 1H. In the following, the descriptions will only focus on the differences. The material of the select gate 106b includes a metal material, such as aluminum, copper, tungsten, cobalt, titanium, tantalum, niobium, or zirconium, etc. The materials of the control gate 112c and the control gate 112d include a metal material, such as aluminum, copper, tungsten, cobalt, titanium, tantalum, niobium, or zirconium, etc.

The high-k dielectric layer 152 (with the value of k greater than 4) is disposed between the select gate 106b and the control gate 112c (or the control gate 112d), between the select gate 106b and the floating gate 108, and between the select gate 106b and the substrate 100. The high-k dielectric layer 152 may include HfO, HfSiO, HfAlO, or HfTaO, for example. By arranging the select gate 106b to be a high-k metal gate (HKMG), the transistor capacitance (by which the current is driven) can be increased, and the gate leakage and the threshold voltage can be decreased. In this way, the device performance is facilitated.

The high-k dielectric layer 154 (with the value of k greater than 4) is disposed between the control gate 112c (or the control gate 112d) and the erase gate 110 and between the control gate 112c (or the control gate 112d) and the floating gate 108. The high-k dielectric layer 154 may include HfO, HfSiO, HfAlO, or HfTaO, for example. By arranging the control gate 112c (or the control gate 112d) to be a high-k metal gate (HKMG), the gate-coupling ratio (GCR) between the floating gate and the control gate is increased, the working voltage required for the operation thereof is decreased, and the operational speed and efficiency of the non-volatile memory are greatly enhanced.

Figure 1K:
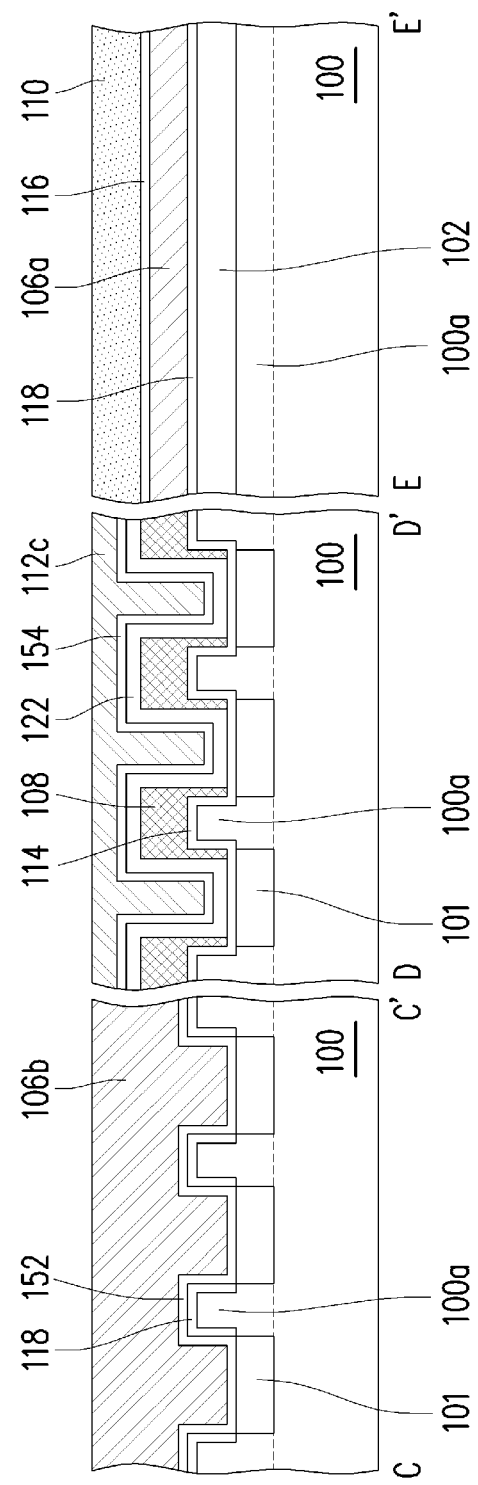
FIG. 1K is a schematic cross-sectional view illustrating a non-volatile memory according to an embodiment of the invention.
Figure 1L:
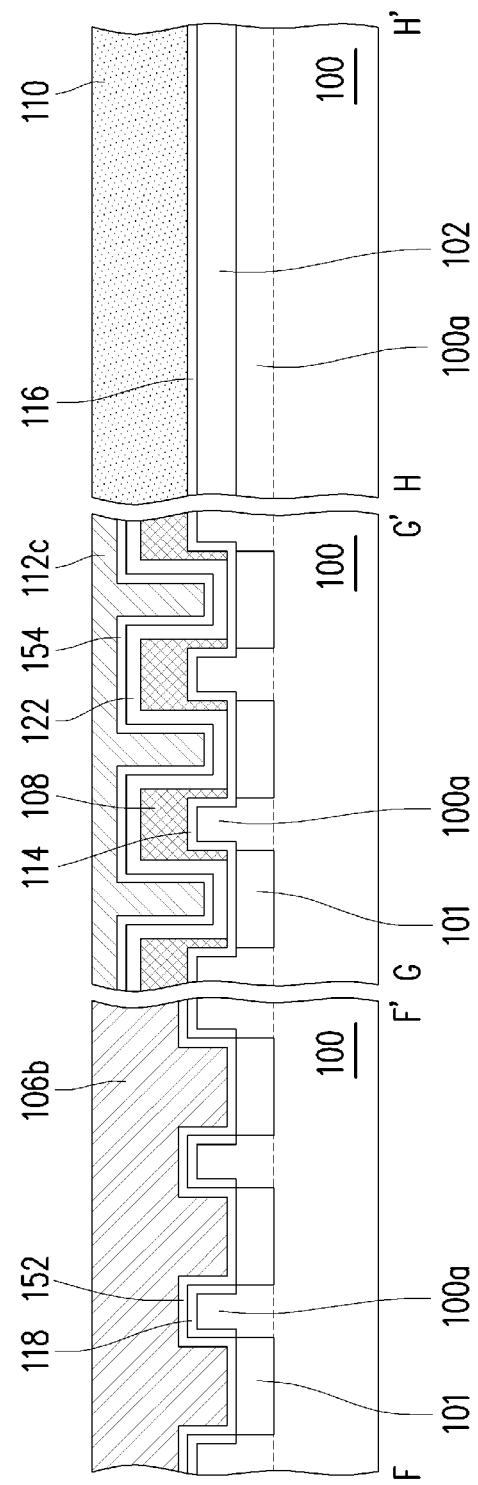
FIG. 1L is a schematic cross-sectional view illustrating a non-volatile memory according to an embodiment of the invention.

In addition, the descriptions of the non-volatile memories in FIGS. 1B to 1J are made with reference to the bulk MOSFET as an example, but of course these non-volatile memories may also be arranged as FinFETs. FIGS. 1K and 1L are respectively schematic cross-sectional views illustrating non-volatile memories as FinFETs according to embodiments of the invention.

The non-volatile memories shown in FIGS. 1K and 1L are respectively the modified examples of the non-volatile memories shown in FIGS. 1G and 1J, and the following descriptions will only focus on the differences. In FIG. 1K, CC', DD', and EE' respectively show the cross-sectional views taken along lines C-C', D-D', and E-E' in FIG. 1G. In FIG. 1L, FF', GG', and HH' respectively show the cross-sectional views taken along lines F-F', G-G', and H-H' in FIG. 1J.

As shown in FIGS. 1K and 1L, the substrate 100 has a fin portion 100a. In addition, the substrate 100 has the isolation structures 101. The isolation structures 101 are located between the fin portion 100a. The isolation structures 101 are shallow trench isolation (STI) structures, for example, to insulate or isolate the fin portion 100a. The floating gate 108 is disposed across the fin portion 100a, for example. In this way, the area sandwiched between the floating gate 108 and the active region is increased (the channel width of the memory cell is increased). In addition, the control gate 112c is also disposed across the fin portion 100a. In this way, the area sandwiched between the control gate 112c and the floating gate 108 is increased, and the coupling rate of the memory device is thus increased.

In the non-volatile memory, the thickness of the select gate dielectric layer 118 is thinner. When the memory cell is being operated, the channel region below the select gate 106 can be turned on or off with a smaller voltage. In other words, the operational voltage can be decreased. The floating gate 108 has a notch that increases the area sandwiched between the control gate 112 and the floating gate 108 and thus increases the coupling rate of the memory device. The floating gate 108 has the corner 126. The erase gate 110 (110a) covers the corner 126, and the angle of the corner 126 is smaller than or equal to 90 degrees. With the corner 126, the electrical field is concentrated, so the erase voltage can be lowered to efficiently pull electrons from the floating gate 108, thereby facilitating the speed of erasing data.

In the non-volatile memory, the surfaces of the select gate 106, the control gate 112a and the control gate 112b, and the erase gate 110 are coplanar. Therefore, the level of integration of the memory device can be increased.

In the non-volatile memory, by arranging the select gate 106b and/or the control gate 112c (the control gate 112d) to be a high-k metal gate (HKMG), the transistor capacitance (by which the current is driven) can be increased, the gate leakage and the threshold voltage can be decreased, and the gate-coupling ratio (GCR) is increased. In this way, the device performance is facilitated.

In the non-volatile memory, with the arrangement as a FinFET, the floating gate 108 is disposed across the fin portion 100a, so the area sandwiched between the floating gate 108 and the active region is increased (the channel width of the memory cell is increased). In addition, the control gate 112c is also disposed across the fin portion 100a. In this way, the area sandwiched between the control gate 112c and the floating gate 108 is increased, and the coupling rate of the memory device is thus increased.

FIGS. 2A to 2I are schematic cross-sectional views illustrating a manufacturing process of a non-volatile memory according to an embodiment of the invention.

Figure 2A:
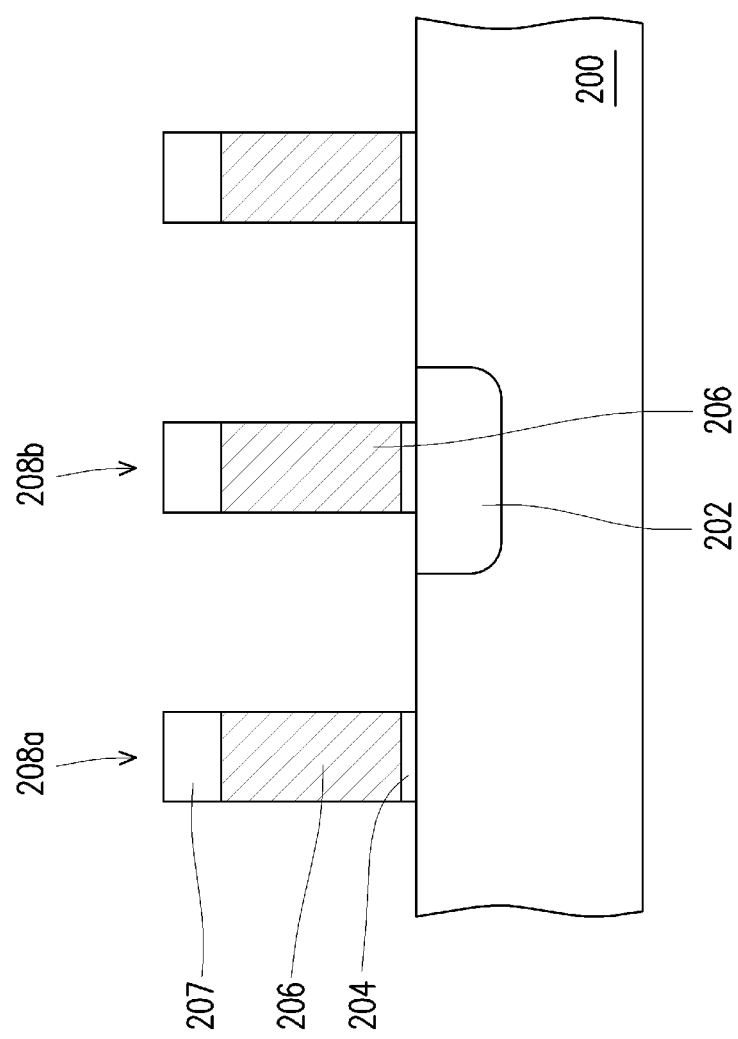

First, as shown in FIG. 2A, a substrate 200 is provided. A source region 202 is formed in the substrate 200. The source region 202 may be formed by performing an ion implantation process, for example. The implanted dopant may be an N-type dopant or a P-type dopant, depending on the design of the device.

Then, a dielectric layer 204, a conductive layer 206, and a sacrificial layer 207 are sequentially formed on the substrate 200. The material of the dielectric layer 204 is, for example, silicon oxide, and the dielectric layer is formed, for example, by thermal oxidation. The material of the conductive layer 206 is, for example, doped polysilicon or polycide, etc. When the material of the conductive layer 206 is doped polysilicon, the conductive 206 layer may be formed by firstly forming an un-doped polysilicon layer by performing a chemical vapor deposition (CVD) process and then performing an ion implanting process. Alternatively, the conductive layer 206 may be formed by conducting in-situ dopant implantation in a CVD process. The material of the sacrificial layer 207 includes one having a different etching selectivity from that of the material of the dielectric layer 204, such as silicon nitride, and the sacrificial layer 207 may be formed by performing a CVD process.

Then, the sacrificial layer 207, the conductive layer 206, and the dielectric layer 204 are patterned to at least form a stacked structure 208a and a stacked structure 208b. The stacked structure 208b is located on the source region 202. The stacked structure 208a and the stacked structure 208b may be formed by, for example, firstly forming a patterned photoresist layer (not shown) on the substrate 200. The patterned photoresist layer is formed by, for example, firstly forming a photoresist material layer on the entire substrate 200, and then performing an exposure process and a development process to form the patterned photoresist layer. Then, using the patterned photoresist layer as a mask, the sacrificial layer 207, the conductive layer 206, and the dielectric layer 204 are removed to form at least the stacked structure 208a and the stacked structure 208b. Next, the patterned photoresist layer is removed. The patterned photoresist layer may be removed by, for example, performing a wet photoresist stripping process or a dry photoresist stripping process. In addition, the dielectric layer 202 serves as a select gate dielectric layer, and the conductive layer 206 serves as a select gate.

Figure 2B:
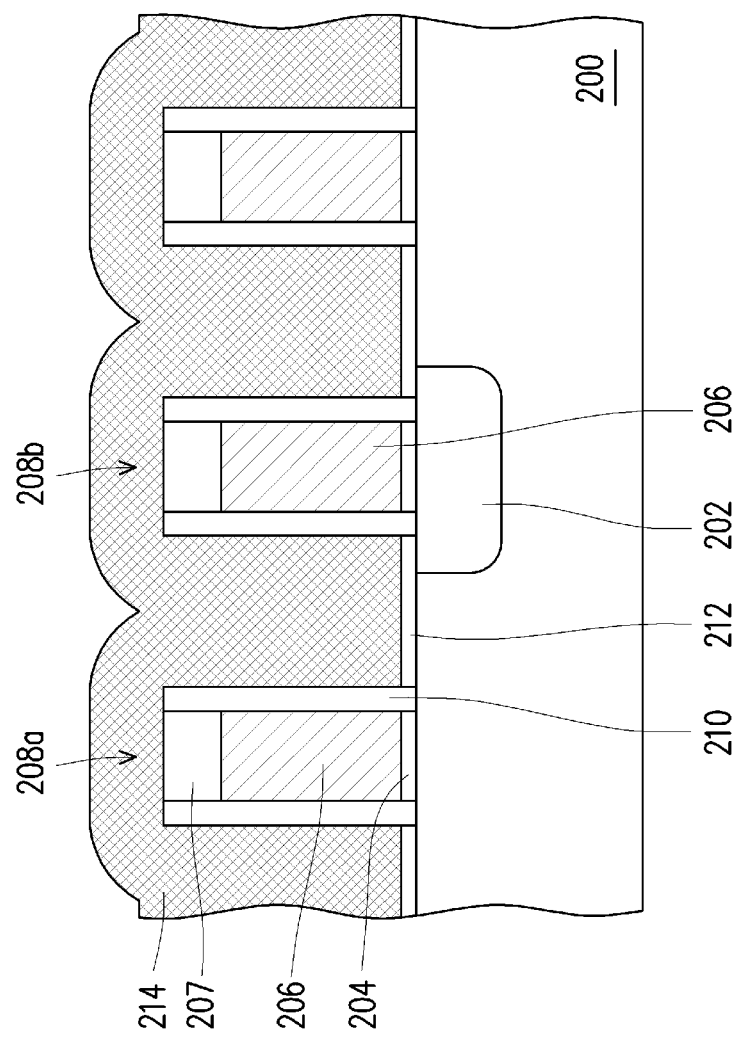

Referring to FIG. 2B, insulating layers 210 are formed on the sidewalls of the stacked structure 208a and the stacked structure 208B. The material of the insulating layer 210 is, for example, silicon oxide/silicon nitride/silicon oxide or silicon nitride/silicon oxide. The insulating layer 210 may be formed by, for example, firstly forming a dielectric layer covering the stacked structure 208a and the stacked structure 208b, and then removing a portion of the dielectric layer to form the insulating layers 210 on the sidewalls of the stacked structure 208a and the stacked structure 208b. The dielectric layer is formed by performing a CVD process, for example. The portion of the dielectric layer may be removed by performing an anisotropic etching process, for example.

Then, a tunneling dielectric layer 212 is formed on the substrate 200 between the stacked structure 208a and the stacked structure 208b. The material of the tunneling dielectric layer 212 is, for example, silicon oxide, and the formation method is, for example, thermal oxidation.

Then, a conductive layer 214 is formed on the substrate 200. The material of the conductive layer 214 is, for example, doped polysilicon or polycide, etc. When the material of the conductive layer is doped polysilicon, the conductive layer may be formed by firstly forming an un-doped polysilicon layer by performing a CVD process and then performing an ion implanting process. Alternatively, the conductive layer may be formed by conducting in-situ dopant implantation in a CVD process. Then, a portion of the conductive layer is removed. The portion of the conductive layer may be removed by performing an anisotropic etching process or an etch back process, for example.

Figure 2C:
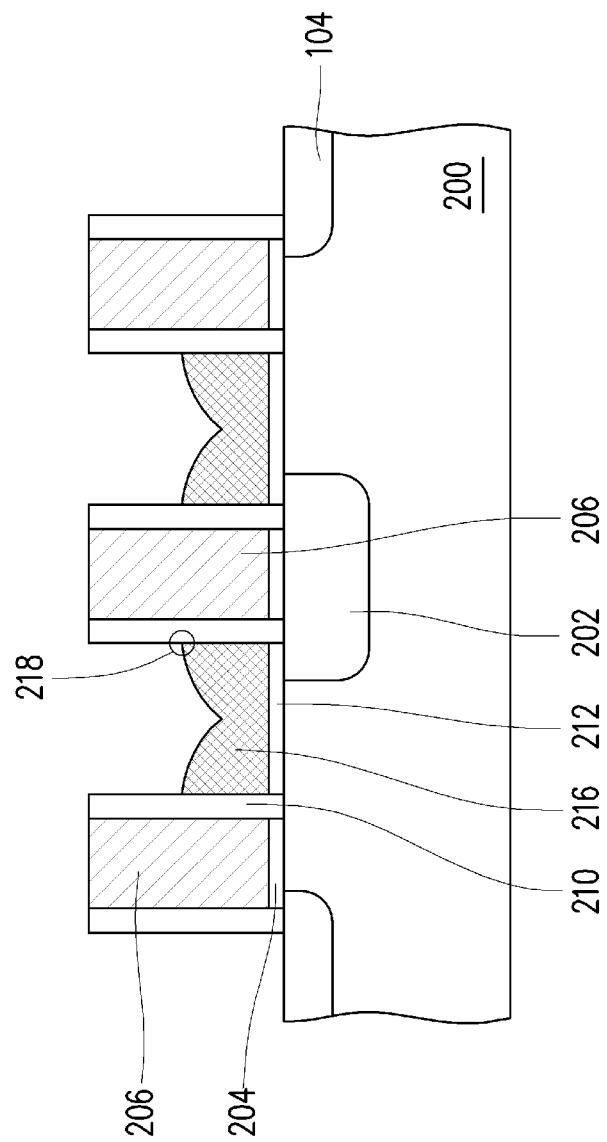

Referring to FIG. 2C, a portion of the conductive layer 214 is removed to form a conductive spacer between the stacked structure 208a and the stacked structure 208b. The portion of the conductive layer may be removed by performing an anisotropic etching process or an etch back process, for example. The height of the conductive spacer is lower than the height of the conductive layer 206 in the stacked structure 208a (or the stacked structure 208b). Then, the conductive spacer is patterned to form a floating gate 216. The conductive spacer may be patterned according to the following. A patterned photoresist (not shown) is formed on the substrate 200. The patterned photoresist layer may be formed by, for example, forming a photoresist material layer on the entire substrate 200, and then performing an exposure process and a development process to form the patterned photoresist layer. Using the patterned photoresist layer as a mask, a portion of the conductive spacer is removed to make the conductive spacer block-shaped, and the conductive spacer between the stacked structure 208a and the stacked structure 208b is retained. The block-shaped conductive spacer between the stacked structure 208a and the stacked structure 208b serves as the floating gate 216. The floating gate 216 has a notch, and is provided with corners 218 at the top portion adjacent to the stacked structure 208a and the stacked structure 208b.

Then, the sacrificial layer 207 is removed. The sacrificial layer 207 may be removed by performing a wet etching process or a dry etching process.

Figure 2D:
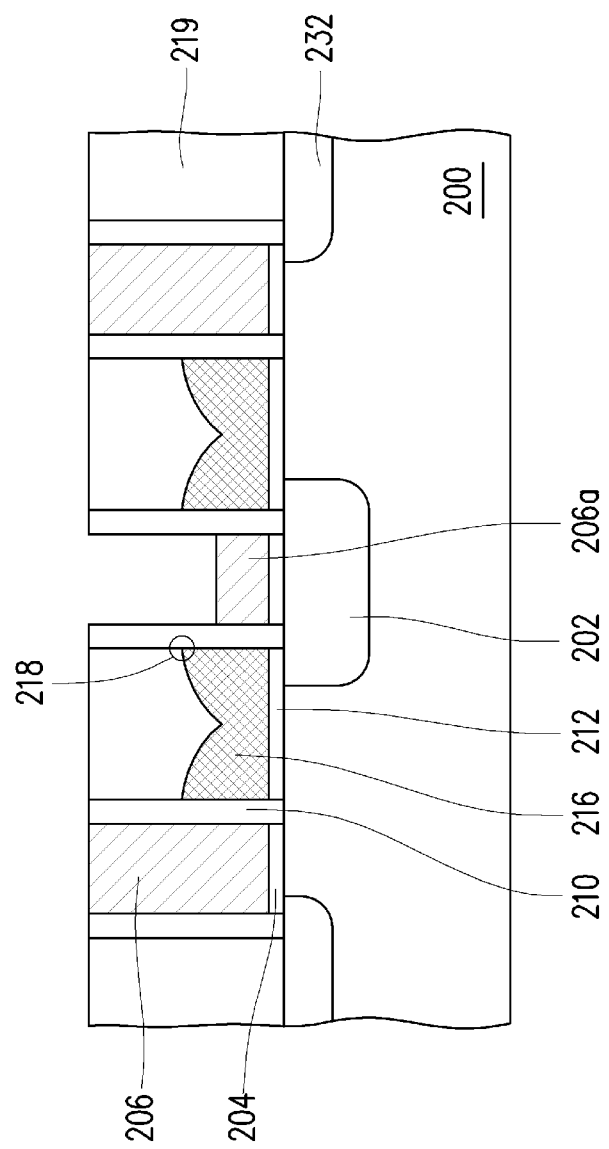

Referring to FIG. 2D, an insulating layer 219 is formed on the substrate 200. The material of the insulating layer 219 is, for example, silicon oxide, etc. The insulating layer 219 may be formed by performing a CVD process, for example. A planarization process is performed on the insulating layer 219. For example, a portion of the insulating layer 219 is removed by performing a chemical mechanical polishing process until the conductive layer 206 is exposed. Then, a patterned photoresist layer (not shown) is formed on the substrate 200 to expose the conductive layer of the stacked structure 208. The patterned photoresist layer may be formed by, for example, forming a photoresist material layer on the entire substrate 200, and then performing an exposure process and a development process to form the patterned photoresist layer. Then, using the patterned photoresist layer as a mask, a portion of the conductive layer 206 of the stacked structure 208b is removed, so that the height of the conductive layer 206 of the stacked structure 208b is lower than the height of the floating gate 216. In other words, at least the corner 218 of the floating gate 216 is exposed. Next, the patterned photoresist layer is removed. The patterned photoresist layer may be removed by, for example, performing a wet photoresist stripping process or a dry photoresist stripping process.

Figure 2E:
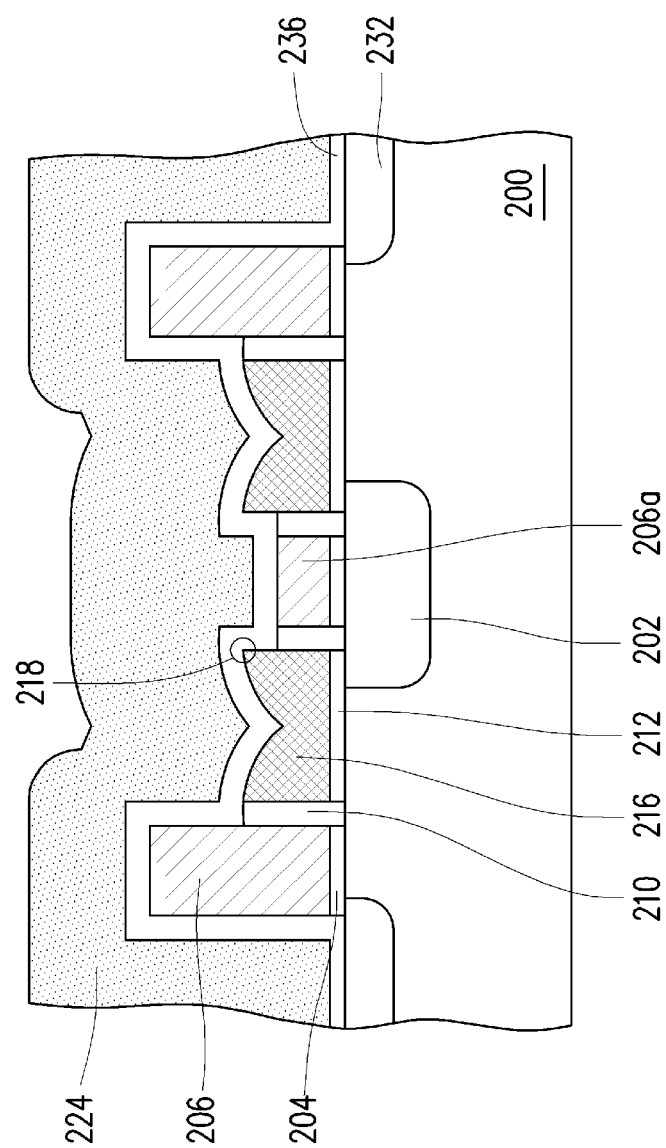

Referring to FIG. 2E, the insulating layer 219 is removed to expose the corner 218 of the floating gate 216. The insulating layer 219 may be removed by performing a wet etching process or a dry etching process, for example. In this process, a portion of the insulating layer 210 is also removed together.

A dielectric layer 222 is formed on the substrate 200. The material of the dielectric layer 222 is, for example, silicon oxide. Then, a conductive layer 224 is formed on the substrate 200. The material of the conductive layer 224 is, for example, doped polysilicon or polycide, etc. When the material of the conductive layer 224 is doped polysilicon, the conductive 224 layer may be formed by firstly forming an un-doped polysilicon layer by performing a CVD process and then performing an ion implanting process. Alternatively, the conductive layer 224 may be formed by conducting in-situ dopant implantation in a CVD process.

Figure 2F:
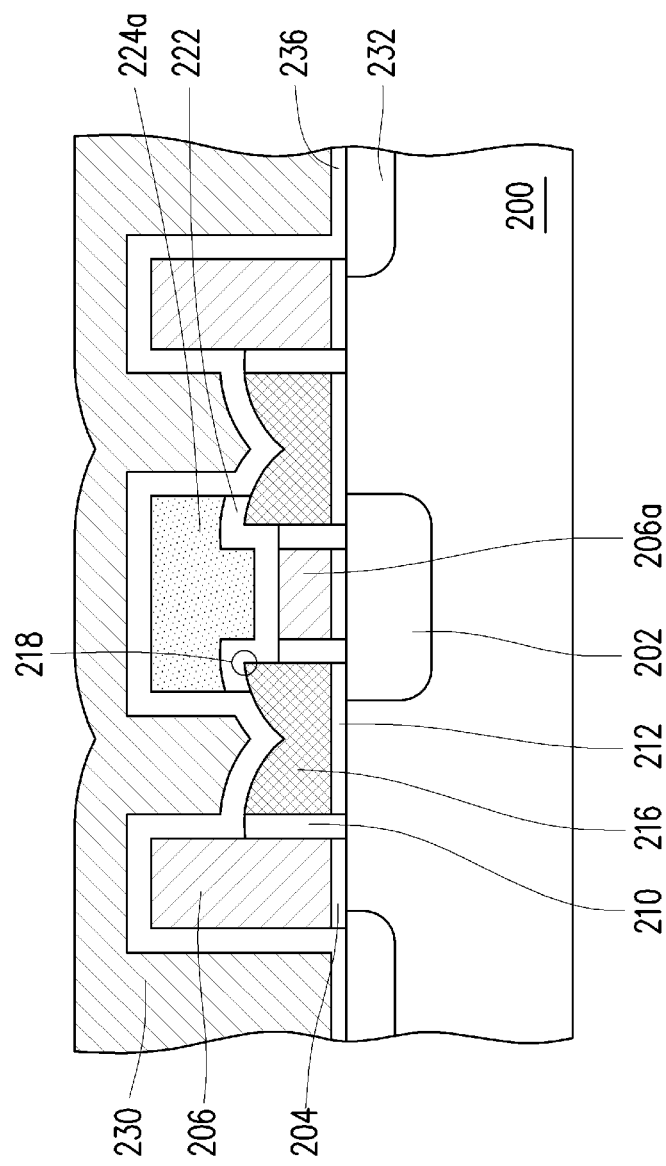

Referring to FIG. 2F, the conductive layer 224 is patterned to form an erase gate 224a. The erase gate 224a is located on the source region 202. The patterned conductive layer 224 is formed by, for example, forming a patterned photoresist layer (not shown) on the substrate 200. The patterned photoresist layer is formed by, for example, forming a photoresist layer on the entire substrate 200, and then performing an exposure process and a development process to form the patterned photoresist layer. Then, using the patterned photoresist layer as a mask, the conductive layer 224 is removed to form at least the erase gate 224a. Next, the patterned photoresist layer is removed. The patterned photoresist layer may be removed by, for example, performing a wet photoresist stripping process or a dry photoresist stripping process. In this process, the dielectric layer 222 not covered by the erase gate 224a may also be removed together. The dielectric layer 222 between the erase gate 224a and the floating gate 216 serves as an erase gate dielectric layer.

Then, an inter-gate dielectric layer 236 is formed on the substrate 200. The inter-gate dielectric layer 236 at least covers the floating gate 216 and the erase gate 224a. The material of the inter-gate dielectric layer 236 includes silicon oxide/silicon nitride/silicon oxide, for example. The inter-gate dielectric layer 236 may be formed by, for example, sequentially forming a silicon oxide layer, a silicon nitride layer, and another silicon oxide layer by performing a CVD process. The material of the inter-gate dielectric layer 236 may also be silicon nitride/silicon oxide or other high-k materials (k>4).

Then, a conductive layer 230 is formed on the substrate 200. The material of the conductive layer 230 is, for example, doped polysilicon or polycide, etc. When the material of the conductive layer 230 is doped polysilicon, the conductive 230 layer may be formed by firstly forming an un-doped polysilicon layer by performing a CVD process and then performing an ion implanting process. Alternatively, the conductive layer 230 may be formed by conducting in-situ dopant implantation in a CVD process.

Figure 2G:
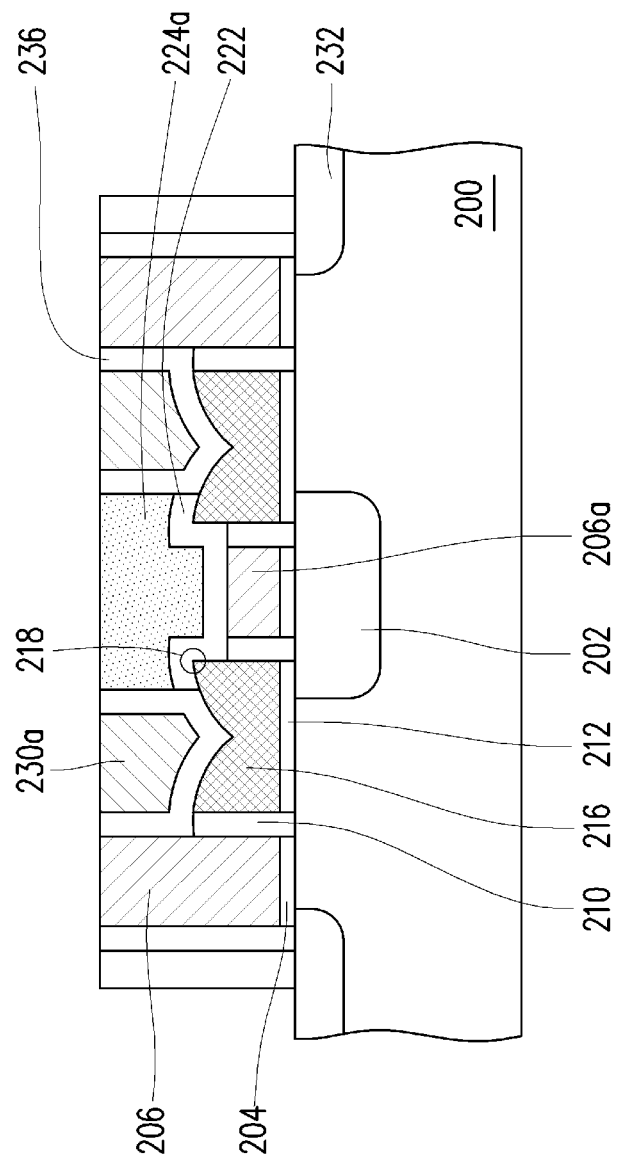

Referring to FIG. 2G, a planarization process is performed on the conductive layer 230. For example, portions of the conductive layer 230 and the inter-gate dielectric layer 236 are removed by performing a chemical mechanical polishing process until the erase gate 224a is exposed. Then, the conductive layer 230 is patterned to form a control gate 230a. The inter-gate dielectric layer 236 is formed between the erase gate 224a and the floating gate 216. The control gate 230a is formed in the notch between the conductive layer 206 (the select gate) and the erase gate 224a.

Then, a drain region 232 is formed in the substrate 200 at a side opposite to the floating gate 216 of the select gate (the conductive gate 206). The drain region 232 may be formed by performing an ion implantation process, for example. The implanted dopant may be an N-type dopant or a P-type dopant, depending on the design of the device. The dopants and dopant concentrations of the source regions 202 and the drain region 232 may be the same or different.

Then, spacers 234 are formed on the sidewalls of the select gate (the conductive layer 206). The material of the spacers 234 is silicon nitride, for example. The spacers 234 may be formed by, for example, forming an insulating layer on the substrate 200, and removing a portion of the insulating layer by performing an anisotropic etching process or an etch back process. When the spacers 234 are formed, the inter-gate dielectric layer 236 not covered by the spacers 234 is also removed.

Figure 2H:
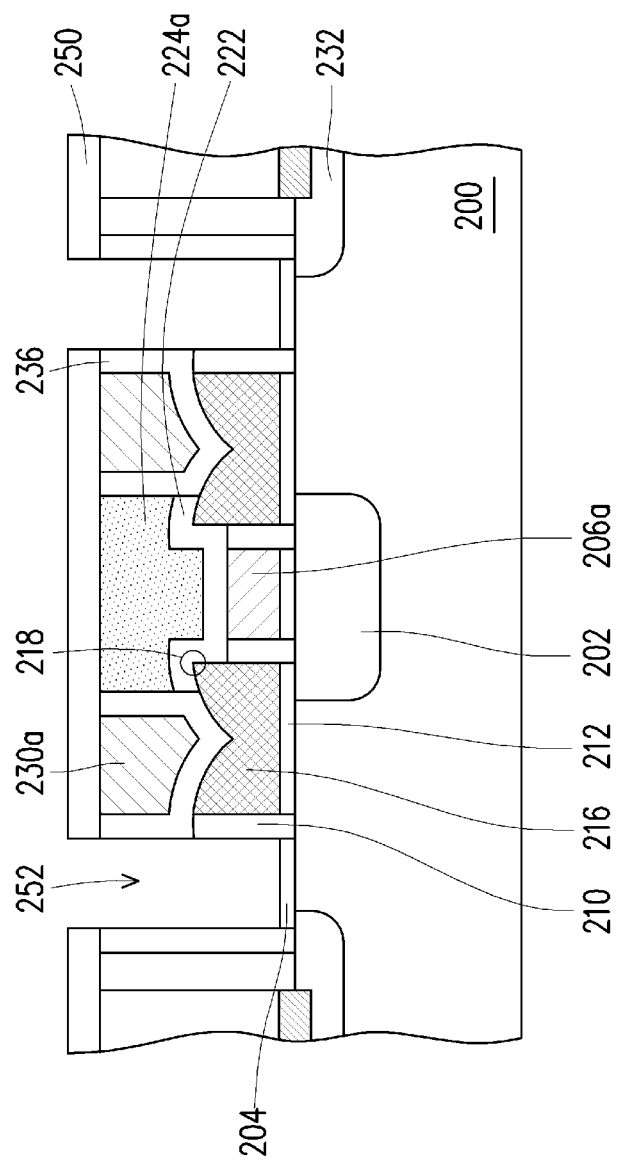
Figure 21:
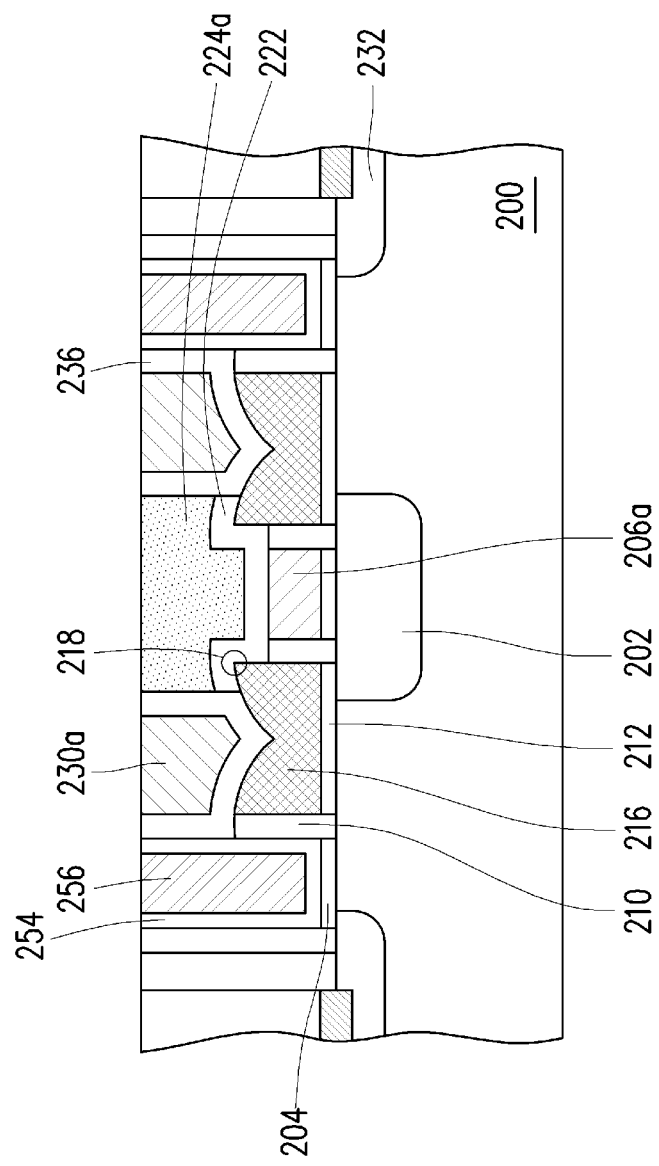

In another embodiment, after FIG. 2G, the processes as shown in FIGS. 2H to 2I may be optionally performed to manufacture the non-volatile memory shown in FIG. 1F.

Referring to FIG. 2H, a blocking layer 250 is formed on the substrate 200. The blocking layer 250 covers the control gate 230a and the erase gate 224a. In other words, at least the conductive layer 206 (the select gate) is exposed. The blocking layer 250 may be formed according to the following. A dielectric layer is formed on the substrate 200. Then, a photoresist material layer is formed on the substrate 200. An exposure process and a development process are performed on the photoresist material layer to form a patterned photoresist layer. Using the patterned photoresist layer as a mask, a portion of the dielectric layer is removed to form the blocking layer 250. The patterned photoresist layer is then removed.

Then, using the blocking layer 250 as a mask, the conductive layer 206 (the select gate) is removed to form an opening 252.

Referring to FIG. 2I, the blocking layer 250 is removed. The blocking layer 250 may be removed by performing a wet etching process, for example. Then, a high-k metal gate (HKMG) manufacturing process is performed. In other words, a high-k dielectric layer and a metal layer are sequentially formed on the substrate 200, and the metal layer 252 fills the opening 252. The high-k dielectric layer may be formed by performing a CVD process, for example. The metal layer may be formed by performing a physical vapor deposition process or a CVD process. A planarization process is performed on the metal layer. For example, a chemical mechanical polishing process is performed to remove a portion of the metal layer until the erase gate 224a is exposed, so as to form the high-k dielectric layer 254 and the select gate 256.

In another embodiment, the non-volatile memory shown in FIG. 1G is manufactured. In FIG. 2H, the blocking layer 250 only covers the erase gate 224a. Using the blocking layer 250 as a mask, the conductive layer 206 (the select gate) and the control gate 230a are removed.

In FIG. 2I, when the high-k metal gate manufacturing process is performed, a control gate made of metal and the high-k dielectric layer 254 are also formed at the position where the control gate 230 is originally located.

Figure 3:
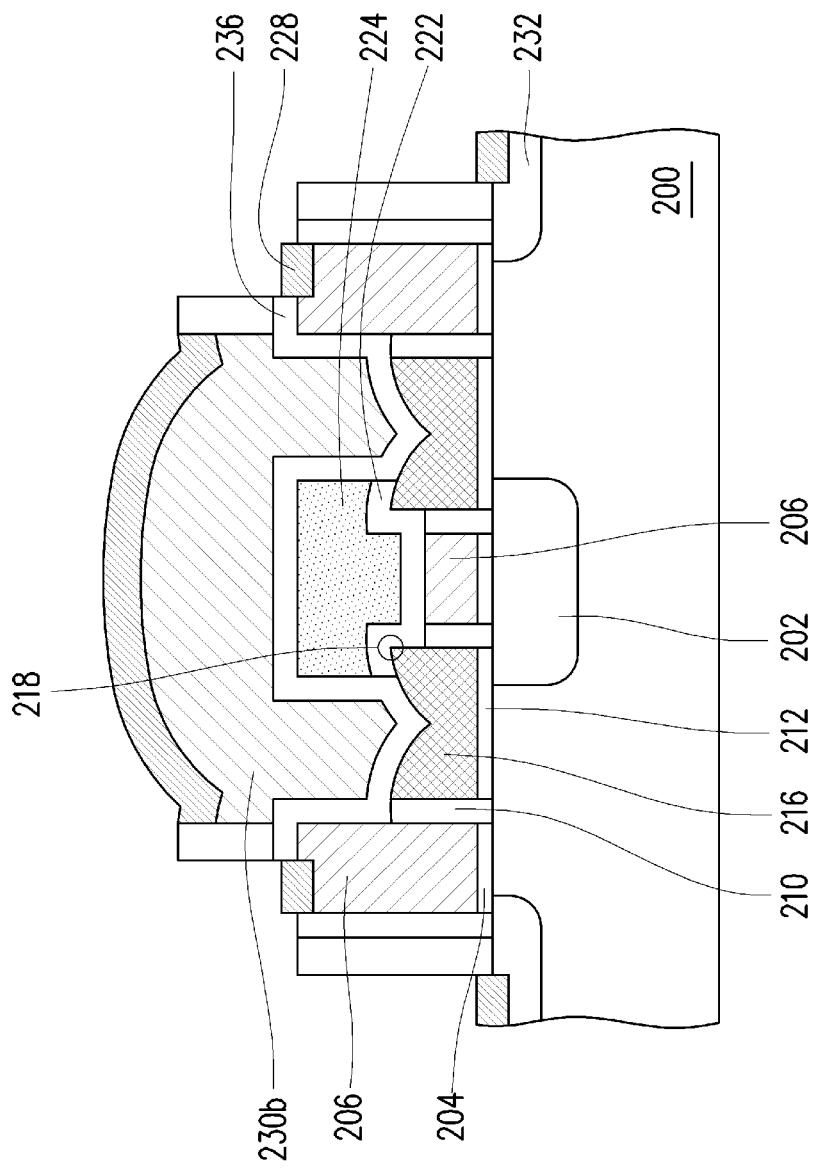
FIG. 3 is a schematic cross-sectional view illustrating a manufacturing process of a non-volatile memory according to an embodiment of the invention.

In another embodiment, in FIG. 3 which follows FIG. 2F, the conductive layer 230 is directly patterned to form a control gate 230b covering the erase gate 224a. Then, the drain region 232, the spacers 234, and the metal silicide layer 228 are formed to manufacture the non-volatile memory shown in FIG. 1B.

Figure 4A:
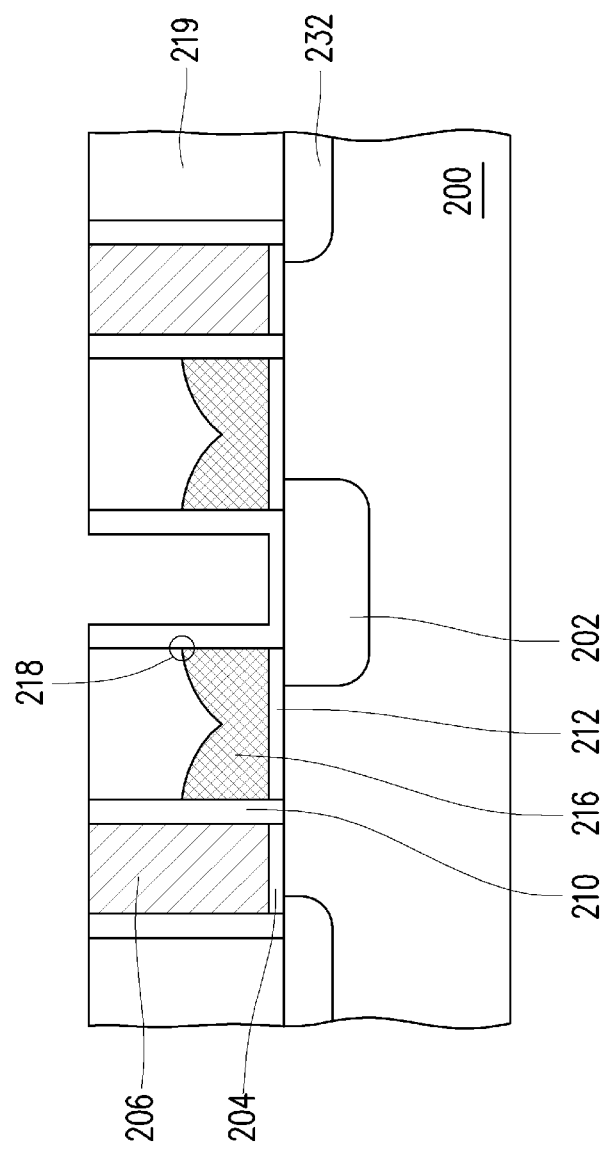
FIGS. 4A to 4B are schematic cross-sectional views illustrating a manufacturing process of a non-volatile memory after a second stacked structure (i.e., a dummy select gate) is removed according to an embodiment of the invention.
Figure 4B:
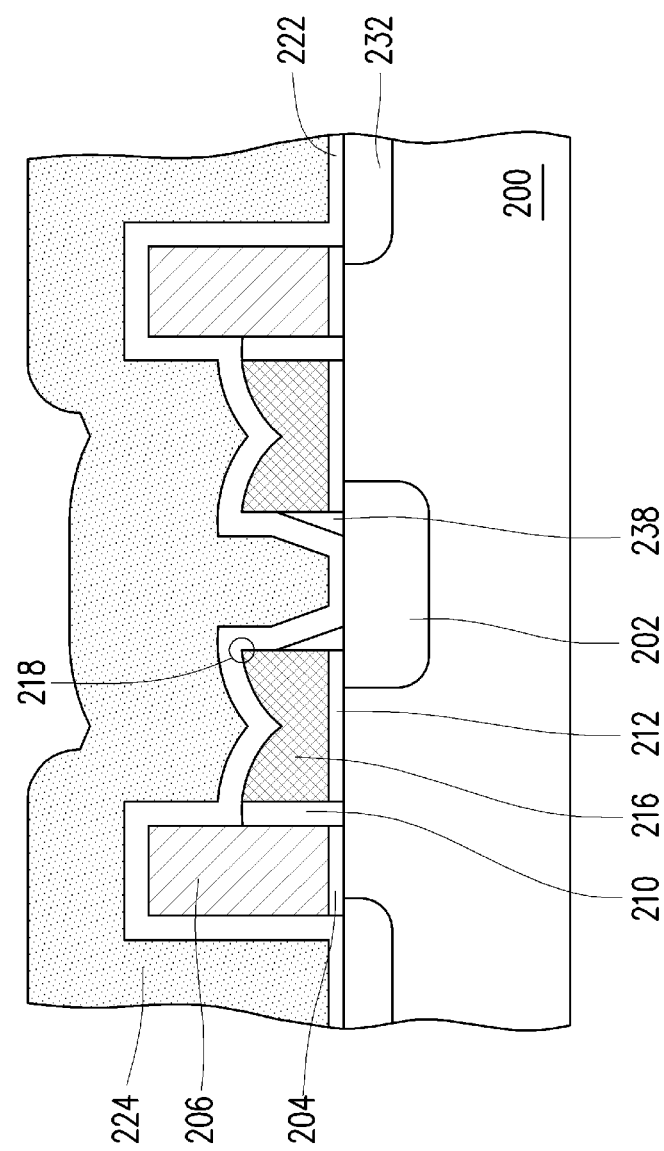

In another embodiment, to manufacture the non-volatile memory shown in FIG. 1H, the processes shown in FIGS. 4A to 4B are performed after FIG. 2C.

Referring to FIG. 4A, the insulating layer 219 is formed on the substrate 200. The material of the insulating layer 219 is, for example, silicon oxide, etc. The insulating layer 219 may be formed by performing a CVD process, for example. A planarization process is performed on the insulating layer 219. For example, a portion of the insulating layer 219 is removed by performing a chemical mechanical polishing process until the conductive layer 206 is exposed. Then, a patterned photoresist layer (not shown) is formed on the substrate 200 to expose the conductive layer of the stacked structure 208. The patterned photoresist layer may be formed by, for example, forming a photoresist material layer on the entire substrate 200, and then performing an exposure process and a development process to form the patterned photoresist layer. Then, using the patterned photoresist layer as a mask, the conductive layer 206 of the stacked structure 208b is completely removed to form a notch. Next, the patterned photoresist layer is removed. The patterned photoresist layer may be removed by, for example, performing a wet photoresist stripping process or a dry photoresist stripping process.

Referring to FIG. 4B, the insulating layer 219 is removed to expose the corner 218 of the floating gate 216. The insulating layer 219 may be removed by performing a wet etching process or a dry etching process, for example. In this process, a portion of the insulating layer 210 is also removed together.

Then, the spacers 238 are formed on the sidewalls of the floating gate 216. The material of the spacers 238 is silicon oxide, for example. The spacers 238 may be formed by, for example, forming an insulating layer on the substrate 200, and removing a portion of the insulating layer by performing an anisotropic etching process or an etch back process. The dielectric layer 222 is formed on the substrate 200. The material of the dielectric layer 222 is, for example, silicon oxide. Then, the conductive layer 224 is formed on the substrate 200. The material of the conductive layer 224 is, for example, doped polysilicon or polycide, etc. When the material of the conductive layer 224 is doped polysilicon, the conductive 224 layer may be formed by firstly forming an un-doped polysilicon layer by performing a CVD process and then performing an ion implanting process. Alternatively, the conductive layer 224 may be formed by conducting in-situ dopant implantation in a CVD process.

The subsequent processes may be referred to the descriptions of FIGS. 2F to 2G. After the erase gate filling the notch is formed, the inter-gate dielectric layer 236, the control gate 230a, the drain region 232, and the spacer 234 are sequentially formed, so as to manufacture the non-volatile memory shown in FIG. 1H.

In another embodiment, the subsequent processes may be referred to the descriptions of FIGS. 2H and 2I. The high-k metal gate (HKMG) manufacturing process is performed, and the material of the select gate and/or the control gate is further replaced with metal.

In the manufacturing process of the non-volatile memory, the control gate formed accordingly covers the side surface and the upper surface of the floating gate. In this way, the area sandwiched between the control gate and the floating gate is increased, so the coupling rate of the memory device is increased. The floating gate has the corner. The erase gate covers the corner, and the angle of the corner is smaller than or equal to 90 degrees. With the corner, the electrical field is concentrated, so the erase voltage can be lowered to efficiently pull electrons from the floating gate, thereby facilitating the speed of erasing data.

In the manufacturing method of the non-volatile memory, the surfaces of the select gate, the control gate, and the erase gate formed accordingly are coplanar. Therefore, the level of integration of the memory device can be increased.

In the non-volatile memory and the manufacturing method thereof, by performing the high-k metal gate (HKMG) manufacturing process so that the select gate and/or the control gate are/is formed as a high-k metal gate (HKMG), the transistor capacitance (by which the current is driven) can be increased, the gate leakage and the threshold voltage can be decreased, and the gate-coupling ratio (GCR) is increased. In this way, the device performance is facilitated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
a first memory cell, disposed on a substrate and comprising:
a source region and a drain region, respectively disposed in the substrate;
a select gate, disposed on the substrate between the source region and the drain region;
a dummy select gate, disposed on the substrate in the source region;
a floating gate, disposed on the substrate between the select gate and the dummy select gate, wherein a height of the floating gate is lower than a height of the select gate, and a top portion of the floating gate has two corners in symmetry;
an erase gate, disposed on the dummy select gate and covering the corners;
a control gate, disposed on the erase gate and the floating gate;
a tunneling dielectric layer, disposed between the floating gate and the substrate;
an erase gate dielectric layer, disposed between the erase gate and the floating gate;
a select gate dielectric layer, disposed between the select gate and the substrate;
an insulating layer, disposed between the select gate and the floating gate; and
an inter-gate dielectric layer, disposed between the control gate and the floating gate and between the control gate and the erase gate.

2. The non-volatile memory as claimed in claim 1, further comprising:
a second memory cell, disposed on the substrate, wherein a structure of the second memory cell is the same as a structure of the first memory cell, and the second memory cell and the first memory cell are arranged in mirror symmetry and share the source region or the drain region.

3. The non-volatile memory as claimed in claim 2, wherein the first memory cell and the second memory cell share the erase gate, and the erase gate fills an opening between the first memory cell and the second memory cell.

4. The non-volatile memory as claimed in claim 3, wherein the first memory cell and the second memory cell share the control gate, and the control gate covers the erase gate.

5. The non-volatile memory as claimed in claim 1, wherein a material of the control gate comprises polysilicon and metal silicide.

6. The non-volatile memory as claimed in claim 1, wherein a material of the select gate comprises polysilicon and metal silicide.

7. The non-volatile memory as claimed in claim 1, wherein the control gate fills an opening between the select gate and the erase gate.

8. The non-volatile memory as claimed in claim 1, wherein a material of the inter-gate dielectric layer comprises silicon oxide/silicon nitride/silicon oxide, silicon nitride/silicon oxide, or other high-k materials with a value of k greater than 4.

9. The non-volatile memory as claimed in claim 1, wherein a material of the select gate dielectric layer comprises silicon oxide or other high-k materials with a value of k greater than 4.

10. The non-volatile memory as claimed in claim 1, wherein an angle of the corner is less than or equal to 90 degrees.

11. The non-volatile memory as claimed in claim 1, wherein a material of the control gate comprises metal.

12. The non-volatile memory as claimed in claim 1, wherein a material of the select gate comprises metal.

13. The non-volatile memory as claimed in claim 1, wherein the erase gate replaces the entire dummy select gate above the source region, and the erase gate covers the corners.

14. The non-volatile memory as claimed in claim 1, wherein the non-volatile memory is arranged as a FinFET.

15. The non-volatile memory as claimed in claim 1, wherein the floating gate has a notch.

* * * * *